(12) United States Patent
Yonezawa

(10) Patent No.: US 7,551,101 B2
(45) Date of Patent: Jun. 23, 2009

(54) LIGHT EMITTING DEVICE DRIVE CONTROLLER, AND A LIGHT EMITTING DEVICE DRIVING APPARATUS

(75) Inventor: Yoshiaki Yonezawa, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 646 days.

(21) Appl. No.: 11/379,978

(22) Filed: Apr. 24, 2006

(65) Prior Publication Data
US 2006/0267861 A1 Nov. 30, 2006

(30) Foreign Application Priority Data
Apr. 22, 2005 (JP) ............................. 2005-125267

(51) Int. Cl.
G08B 5/22 (2006.01)
G08B 21/00 (2006.01)
H05B 41/00 (2006.01)

(52) U.S. Cl. ........................... 340/815.45; 340/636.15; 340/657; 340/660; 315/185 R; 315/186; 315/192

(58) Field of Classification Search .................. None
See application file for complete search history.

(56) References Cited

U.S. PATENT DOCUMENTS 5,309,920 A * 5/1994 Gallant et al. ............... 600/523

6,538,570 B1 * 3/2003 Smith ......................... 340/550
2007/0273299 A1 * 11/2007 Miskin et al. ............... 315/250

FOREIGN PATENT DOCUMENTS

JP 2004-14228 1/2004

* cited by examiner

Primary Examiner—Julie Lieu
(74) Attorney, Agent, or Firm—Fish & Richardson P.C.

(57) ABSTRACT

A light emitting device drive controller is disclosed that comprises a first port that is connected to one end of a first light emitting device group where two light emitting devices are connected in parallel in the opposite directions; a second port that is connected to the other end of the first light emitting device group as well as connected to one end of a second light emitting device group where two light emitting devices are connected in parallel in the opposite directions; a third port that is connected to the other end of the second light emitting device group; and a port state setting unit that selectively sets each of the first, second, and third ports to any one of a state of a first voltage, a state of a second voltage which is less than the first voltage, and a high impedance state for each consecutive predetermined period, wherein the light emitting device drive controller drives selectively the light emitting devices constituting the first light emitting device group and the second light emitting device group in response to the states of the first, second, and third ports.

17 Claims, 11 Drawing Sheets

LIGHT EMITTING DEVICE DRIVE CONTROLLER, AND A LIGHT EMITTING DEVICE DRIVING APPARATUS

CROSS-REFERENCE TO RELATED APPLICATIONS

The present application claims priority from Japanese Patent Applications No. 2005-125267 filed on Apr. 22, 2005, which is herein incorporated by reference.

BACKGROUND OF THE INVENTION

1. Field of the Invention

The present invention relates to a light emitting device drive controller and a light emitting device driving apparatus that are suitable to check a changing state of a predetermined factor (e.g., a remaining amount level of a voltage value of a battery) with an ON/OFF state of a light emitting device.

2. Description of the Related Art

A portable electronic device (e.g., notebook personal computer) is equipped with a battery and is supplied with power from the battery to operate. The power supply capacity from the battery is reduced as the electronic device is utilized by a user and will not be able to supply power at a level that can operate the electronic device normally over time. During the course of the normal operation of the electronic device, if the battery cannot supply power that can operate the electronic device normally, the electronic device stops operation that should be performed under normal circumstances or operates improperly. To solve such inconveniences, technologies are disclosed for checking a remaining amount level of a voltage value of a battery (a changing state of a predetermined factor) (e.g., Japanese Patent Application Laid-Open Publication No. 2004-14228). It is known that technologies for checking a state of a battery include a technology for calculating a remaining usable time of a battery for numerical display on a display and a technology for performing indicator display of a remaining amount level of a battery. For example, a plurality of LEDs is applied to the latter indicator display technology. The plurality of LEDs is provided on, for example, a portion of a battery pack mounted to the electronic device in the shape of an indicator (aligned in a line).

Description will be made of an example of the indicator display technology using LEDs with reference to FIG. 12 and FIG. 13. FIG. 12 is a circuit block diagram of an example of a conventional light emitting device driving apparatus. In FIG. 12, five LEDs 1 to 5 (light emitting devices) are driven selectively and statically. FIG. 13 is a circuit block diagram of another example of a conventional light emitting device driving apparatus. In FIG. 13, five LEDs 101 to 105 (light emitting devices) are driven selectively and dynamically. In FIG. 13, the same numbers are added to the same components as FIG. 12 and the description thereof will not be made.

<<Static Drive Type Light Emitting Device Driving Apparatus>>

In FIG. 12, a battery remaining amount detecting unit 13 detects a remaining amount (currently charged voltage value) of a battery 14 mounted for operating an electronic device to the electronic device. For example, the battery remaining amount detecting unit 13 detects the remaining amount of the battery 14 periodically at predetermined time intervals and outputs the detected remaining amount as binarized battery remaining amount data. That is, the battery remaining amount data are updated at predetermined time intervals.

A microcomputer 6 performs static drive to turn on/off any of the five LEDs 1 to 5 selectively based on the battery remaining amount data supplied from the external battery remaining amount detecting unit 13. That is, the microcomputer 6 divides the remaining amount range of the battery 14 into five ranges from an empty state to a fully charged state and if the remaining amount of the battery 14 is less than $1/5$, only the LED 1 is turned on; if the remaining amount of the battery 14 is $1/5$ or greater and less than $2/5$, the LEDs 1, 2 are turned on; if the remaining amount of the battery 14 is $2/5$ or greater and less than $3/5$, the LEDs 1 to 3 are turned on; if the remaining amount of the battery 14 is $3/5$ or greater and less than $4/5$, the LEDs 1 to 4 are turned on; and if the remaining amount of the battery 14 is $4/5$ or greater, all the LEDs 1 to 5 are turned on. An anode of each LED 1 to 5 is connected to a power supply voltage port VDD of the microcomputer 6 via a limiting resistor 7 to 11 to limit the current of the LED 1 to 5. On the other hand, a cathode of each LED 1 to 5 is connected to a control port C1 to C5 for turning on/off the LED 1 to 5. A switch 12 for checking the remaining amount of the battery 14 is connected between the power supply voltage port VDD and a control port C6. The switch 12 is operated when a user checks the remaining amount of the battery 14 and is configured to be closed (ON) only during the operation and to be opened (OFF) when not operated. The control port C6 is grounded via a resistor 15 on the outside of the microcomputer 6 (or may be grounded within the microcomputer 6). The control port C6 is a port that is pulled down to low level within the microcomputer 6 when the switch 12 is off (opened).

When the switch 12 is operated (to be the closed state) to check the remaining amount of the battery 14, the control port C6 of the microcomputer 6 is pulled up to a voltage level of the power supply voltage port VDD and is changed from low level to high level. The microcomputer 6 detects that the control port C6 is changed to high level and the detection result is used as an interruption request to start execution of a program for performing the LED display of the remaining amount level of the battery 14.

First, the microcomputer 6 acquires the battery remaining amount data detected in the battery remaining amount detecting unit 13. The microcomputer 6 then finds out which LED of the LEDs 1 to 5 is instructed to be turned on by the battery remaining amount data in accordance with an arithmetic processing program. For example, if the remaining amount of the battery 14 is $2/5$ or greater and less than $3/5$, this content instructs to turn on the LEDs 1 to 3. In this case, the microcomputer 6 sets the control ports C1, C2, and C3 to low level and sets the control ports C4 and C5 to high level. In this way, the LEDs 1 to 3 are turned on for a time period determined by the program of the microcomputer 6, and the user can learn that the remaining amount of the battery 14 is $2/5$ or greater and less than $3/5$.

If the remaining amount of the battery 14 is other than the above description, any LEDs 1 to 5 can be turned on correspondingly to the remaining amount of the battery 14 by changing the levels of the control ports C1 to C5 correspondingly to the battery remaining amount data.

<<Dynamic Drive Type Light Emitting Device Driving Apparatus>>

In FIG. 13, a microcomputer 106 performs dynamic drive to turn on/off any of the five LEDs 101 to 105 selectively based on the battery remaining amount data supplied from the external battery remaining amount detecting unit 13. That is, the microcomputer 106 divides the remaining amount range of the battery 14 into five ranges from an empty state to a fully charged state and if the remaining amount of the battery 14 is less than $1/5$, only the LED 101 is turned on; if the remaining amount of the battery 14 is $1/5$ or greater and less than $2/5$, the LEDs 101, 102 are turned on; if the remaining amount of the battery 14 is ⅖ or greater and less than ⅗, the LEDs 101 to 103 are turned on; if the remaining amount of the battery 14 is ⅗ or greater and less than ⅘, the LEDs 101 to 104 are turned on; and if the remaining amount of the battery 14 is ⅘ or greater, all the LEDs 101 to 105 are turned on. Anodes of the LEDs 101 and 102 are connected to a control port C103 of the microcomputer 106 via a limiting resistor 107 to limit the current of the LEDs 101 and 102. Anodes of the LEDs 103 and 104 are connected to a control port C102 of the microcomputer 106 via a limiting resistor 108 to limit the current of the LEDs 103 and 104. An anode of the LED 105 is connected to a control port C101 of the microcomputer 106 via a limiting resistor 109 to limit the current of the LED 105. On the other hand, cathodes of the LEDs 101, 103, 105 are connected to a control port C104 of the microcomputer 106 and cathodes of the LEDs 102 and 104 are connected to a control port C105 of the microcomputer 106. A switch 110 for checking the remaining amount of the battery 14 is connected between the power supply voltage port VDD and a control port C106. The switch 10 is operated when a user checks the remaining amount of the battery 14 and is configured to be closed (ON) only during the operation and to be opened (OFF) when not operated. The control port C106 is grounded via a resistor 111 on the outside of the microcomputer 6 (or may be grounded within the microcomputer 6). The control port C106 is a port that is pulled down to low level within the microcomputer 6 when the switch 110 is off (opened).

When the switch 110 is operated (to be the closed state) to check the remaining amount of the battery 14, the control port C106 of the microcomputer 106 is pulled up to a voltage level of the power supply voltage port VDD and is changed from low level to high level. The microcomputer 106 detects that the control port C106 is changed to high level and the detection result is used as an interruption request to start execution of a program for performing the LED display of the remaining amount level of the battery 14.

First, the microcomputer 106 acquires the battery remaining amount data detected in the battery remaining amount detecting unit 13. The microcomputer 106 then finds out which LED of the LEDs 101 to 105 is instructed to be turned on by the battery remaining amount data in accordance with the arithmetic processing program. For example, if the remaining amount of the battery 14 is ⅖ or greater and less than ⅗, this content instructs to turn on the LEDs 101 to 103. In this case, the microcomputer 106 sets the control port C103 to high level and sets the control ports C104 and the control ports C102 and C105 to a predetermined frequency (e.g., 100 Hz) as well as to high level and low level, respectively, in a reversed phase. The microcomputer 106 sets the control port C101 to low level. In this way, the LEDs 101, 103 and the LED 102 are turned on and off repeatedly for a time period determined by the program of the microcomputer 6 at respective predetermined frequencies in a complementary manner. For example, if the LED is turned on and off repeatedly at 100 Hz, the LED looks like turned on continuously to the human naked eye. That is, the user can learn that the remaining amount of the battery 14 is ⅖ or greater and less than ⅗.

If the remaining amount of the battery 14 is other than the above description, any LEDs 101 to 105 can be turned on correspondingly to the remaining amount of the battery 14 by changing the levels of the control ports C101 to C105 correspondingly to the battery remaining amount data.

However, in the case of the static drive type light emitting device driving apparatus shown in FIG. 12, the microcomputer 6 must be provided with the number of the control ports corresponding to the number of the LEDs one-on-one (five in the case of FIG. 12). Therefore, the total number of the ports of the microcomputer 6 is increased proportionally to the number of the LEDs and the size of the microcomputer 6 may be enlarged, which is problematic.

On the other hand, in the case of the dynamic drive type light emitting device driving apparatus shown in FIG. 13, the microcomputer 6 must be provided with the number of the control ports for turning on the LEDs, which is a sum of the number of the LEDs (with a common anode) constituting a LED group surrounded by a dotted line and the number of the LED groups (five in the case of FIG. 13). In the dynamic drive type light emitting device driving apparatus, as compared to the static drive type light emitting device driving apparatus, the number of the control ports can be more constrained as the number of the LEDs increases. Specifically, when the total number of the LEDs is six or more, the effect of reducing the number of the control port is exerted on the dynamic drive type light emitting device driving apparatus as compared to the static drive type light emitting device driving apparatus. Otherwise, if the total number of the LEDs is one to three, the number of the control ports of the static drive type light emitting device driving apparatus is less than that of the dynamic drive type light emitting device driving apparatus. If the total number of the LEDs is four or five, the number of the control ports of the static drive type light emitting device driving apparatus is equal to that of the dynamic drive type light emitting device driving apparatus.

By the way, when the indicator display of the remaining amount of the battery 14 is performed with the use of a plurality of LEDs built into the battery pack, the number of the LEDs is typically four or five, for example. However, as described in the light emitting device driving apparatuses of FIGS. 12 and 13, if the total number of the LEDs is four or five, the number of the control ports must be four or five to turn on the LEDs and it is difficult to make the number of the control ports three or less. Therefore, in the light emitting device driving apparatus that controls the lighting of the four or five LEDs, the number of the control ports of the microcomputers 6, 106 cannot be reduced to three or less and it is problematic that the sizes and costs cannot be reduced in the microcomputers 6, 106. The number cannot also be reduced for the wirings connecting a display substrate provided with the LEDs and a substrate provided with the microcomputers 6, 106, and it is problematic that the costs of the apparatus itself cannot be reduced.

SUMMARY OF THE INVENTION

It is therefore an object of the present invention to provide a light emitting device drive controller and light emitting device driving apparatus that can reduce the number of ports necessary for selectively driving tour or five light emitting devices as compared to the conventional case.

In order to achieve the above and other objects, according to a first aspect of the present invention there is provided a light emitting device drive controller comprising a first port that is connected to one end of a first light emitting device group where two light emitting devices are connected in parallel in the opposite directions; a second port that is connected to the other end of the first light emitting device group as well as connected to one end of a second light emitting device group where two light emitting devices are connected in parallel in the opposite directions; a third port that is connected to the other end of the second light emitting device group; and a port state setting unit that selectively sets each of the first, second, and third ports to any one of a state of a first voltage, a state of a second voltage which is less than the first voltage, and a high impedance state for each consecutive predetermined period, wherein the light emitting device drive controller drives selectively the light emitting devices constituting the first light emitting device group and the second light emitting device group in response to the states of the first, second, and third ports.

To achieve the above and other objects, according to a second aspect of the present invention there is provided a light emitting device drive controller comprising a first port that is connected to one end of a first light emitting device group where two light emitting devices are connected in parallel in the opposite directions; a second port that is connected to the other end of the first light emitting device group as well as connected to one end of the second light emitting device group where two light emitting devices are connected in parallel in the opposite directions; a third port that is connected to the other end of the second light emitting device group; a fourth port that is connected to the other end of a switch for checking a state of a change in a predetermined factor, the switch including one end connected to the first port; a detecting unit that detects that the switch is closed; and a port state setting unit that selectively sets all or some of the first, second, third, and fourth ports to any one of a state of a first voltage, a state of a second voltage which is less than the first voltage, and a high impedance state for each consecutive predetermined period based on a detection result when the detecting unit detects that the switch is closed and the state of the change in the predetermined factor, wherein the light emitting device drive controller drives selectively the light emitting devices constituting the first light emitting device group and the second light emitting device group in response to the states of the first, second, third, and fourth ports.

To achieve the above and other objects, according to a third aspect of the present invention there is provided a light emitting device driving apparatus comprising a first light emitting device group where two light emitting devices are connected in parallel in the opposite directions; a second light emitting device group where two light emitting devices are connected in parallel in the opposite directions; a first port that is connected to one end of the first light emitting device group; a second port that is connected to the other end of the first light emitting device group as well as connected to one end of the second light emitting device group; a third port that is connected to the other end of the second light emitting device group; and a port state setting unit that selectively sets each of the first, second, and third ports to any one of a state of a first voltage, a state of a second voltage which is less than the first voltage, and the high impedance state for each consecutive predetermined period, wherein the light emitting device driving apparatus drives selectively the light emitting devices constituting the first light emitting device group and the second light emitting device group in response to the states of the first, second, and third ports.

To achieve the above and other objects, according to a fourth aspect of the present invention there is provided a light emitting device driving apparatus comprising a first light emitting device group where two light emitting devices are connected in parallel in the opposite directions; a second light emitting device group where two light emitting devices are connected in parallel in the opposite directions; a switch for checking a state of a change in a predetermined factor;

a first port that is connected to one end of the first light emitting device group; a second port that is connected to the other end of the first light emitting device group as well as connected to one end of the second light emitting device group; a third port that is connected to the other end of the second light emitting device group; a fourth port that is connected to the other end of the switch, the switch including one end connected to the first port; a detecting unit that detects that the switch is closed; and a port state setting unit that selectively sets all or some of the first, second, third, and fourth ports to any one of a state of a first voltage, a state of a second voltage which is less than the first voltage, and the high impedance state for each consecutive predetermined period based on a detection result when the detecting unit detects that the switch is closed and the state of the change in the predetermined factor, wherein the light emitting device driving apparatus drives selectively the light emitting devices constituting the first light emitting device group and the second light emitting device group in response to the states of the first, second, third, and fourth ports.

BRIEF DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

With the description of this specification and the accompanying drawings, at least the following matters will become apparent.

FIRST IMPLEMENTATION

Figure 1:
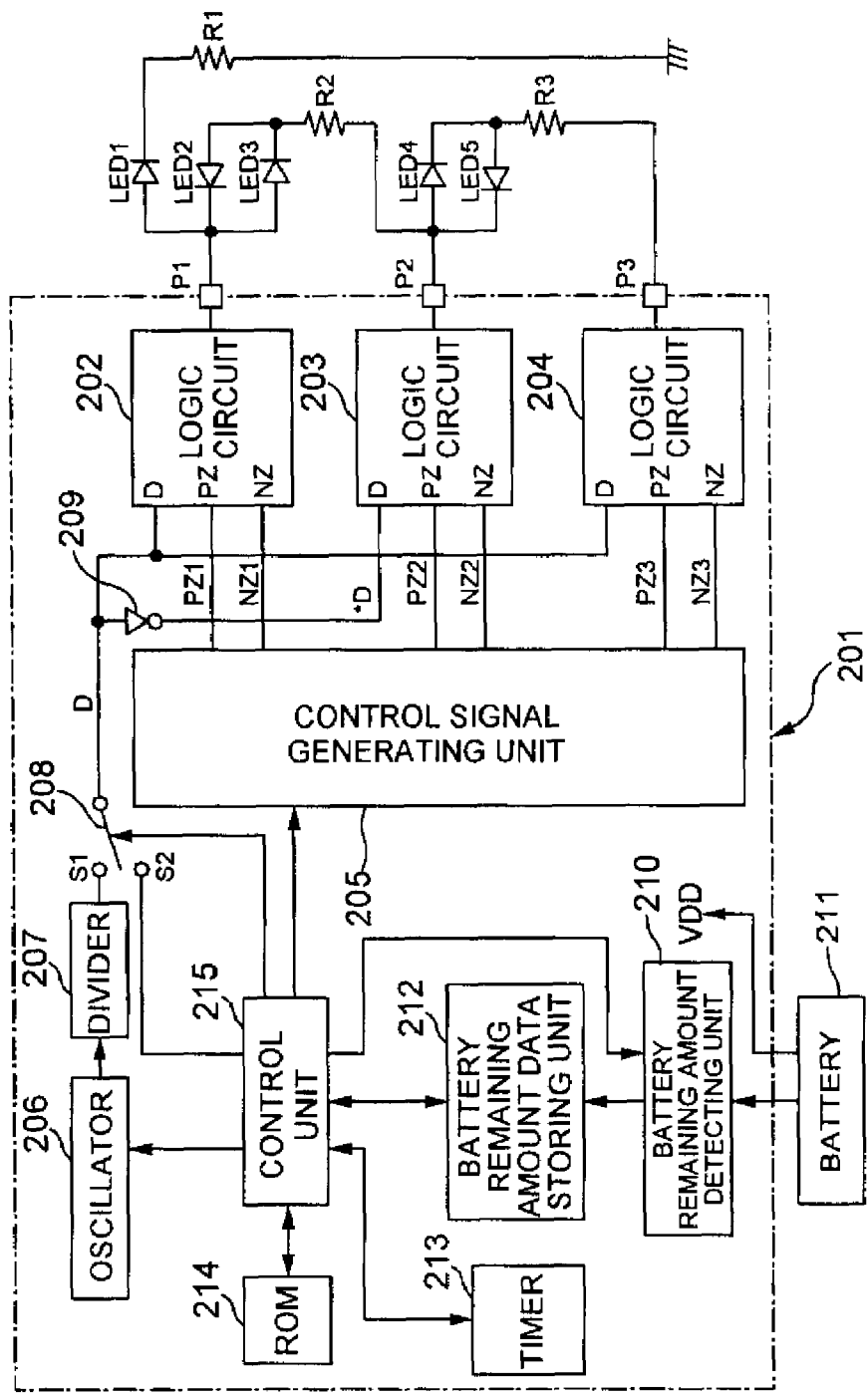
FIG. 1 is a circuit block diagram of the first implementation of the present invention.

With reference to FIG. 1, description will be made of a light emitting device drive controller and a light emitting device driving apparatus of the present invention. FIG. 1 is a circuit block diagram of the light emitting device driving apparatus of the present invention. In FIG. 1, a configuration surrounded by a dot-and-dash line on the page shows the light emitting device drive controller, which is constituted by an integrated circuit, for example, a microcomputer with a controlling function of turning on/off light emitting devices and which is disposed on a first printed board (not shown) for driving the light emitting devices. On the other hand, a rightward configuration not surrounded by the dot-and-dash line on the page is external components of the integrated circuit, which is disposed on a second printed board for display (not shown: e.g., a board within a display). In the implementation of the following description, the light emitting device drive controller and the light emitting device driving apparatus of the present invention are used for the purpose of performing indicator display of a remaining amount level of a battery mounted to an electronic device for supplying a power supply voltage to the electronic device, for example.

<<External Configuration of Integrated Circuit>>

An integrated circuit 201 includes control ports P1, P2, P3 for externally connecting the external components, i.e., LEDs 1 to 5, a limiting resistor R1 that limits a current of the LED 1, a limiting resistor R2 that limits currents of the LEDs 2 and 3, and a limiting resistor R3 that limits currents of the LEDs 4 and 5. Among the LEDs 1 to 5 that are light emitting devices, the LED 1 corresponds to a single light emitting device. The LEDs 2 and 3 are connected in parallel in the opposite directions and correspond to a first light emitting device group. The LEDs 4 and 5 are connected in parallel in the opposite directions and correspond to a second light emitting device group. The control ports P1 to P3 correspond to first to third ports, respectively.

Specifically, the control port P1 is connected to a cathode of the LED 2 and an anode of the LED 3, which are one end of the first light emitting device group. The control port P1 is also connected to an anode of the LED 1 and a cathode of the LED 1 is grounded via the limiting resistor R1.

The control port P2 is connected to an anode of the LED 2 and a cathode of the LED 3, which are the other end of the first light emitting device group, via the limiting resistor R2. The control port P2 is also connected to an anode of the LED 4 and a cathode of the LED 5, which are one end of the second light emitting device group.

The control port P3 is connected to a cathode of the LED 4 and an anode of the LED 5, which are the other end of the second light emitting device group, via the limiting resistor R3.

<<Internal Configuration of Integrated Circuit>>

Figure 2:
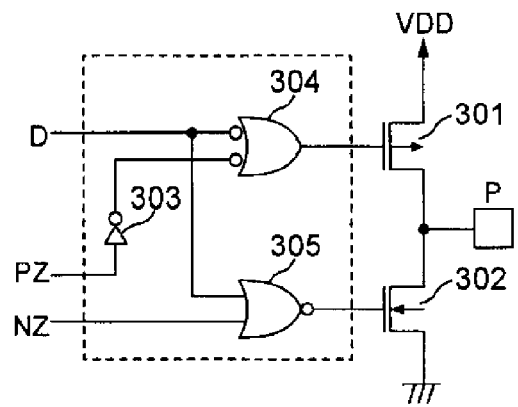
FIG. 2 is a circuit diagram of a configuration example of a logic circuit used in the first implementation.
Figure 3:
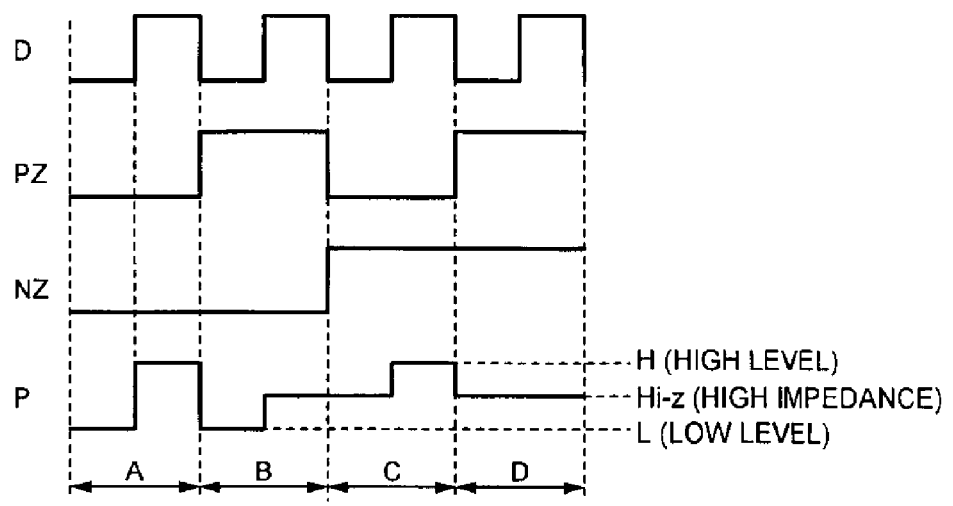
FIG. 3 is a time chart of the operation of the logic circuit of FIG. 2.

The control ports P1 to P3 are connected to output terminals of logic circuits 202 to 204 for selectively turning on/off the LEDs 1 to 5. With reference to FIGS. 2 and 3, description will be made of an example of a configuration and operation of the logic circuits 202 to 204. FIG. 2 is a circuit diagram of an example of a configuration of the logic circuit. FIG. 3 is a time chart of the operation of the logic circuit. In the implementation, the same logic circuits are applied to the logic circuits 202 to 204.

The logic circuit 202 (203, 204) is composed of a P-MOSFET 301 and an N-MOSFET 302 serially connected between a power supply voltage VDD and ground, and a logical circuit (inverter 303, NAND gate 304, and NOR gate 305). Specifically, the gate of the P-MOSFET 301 is connected to the output of the NAND gate 304, and the gate of the N-MOSFET 302 is connected to the output of the NOR gate 305. A clock signal D is supplied commonly to one input terminal of the NAND gate 304 and the NOR gate 305. A first control signal PZ is supplied to the other input terminal of the NAND gate 304 via the inverter 303. A second control signal NZ is supplied to the other input terminal of the NOR gate 305. The clock signal D is a rectangular signal with a frequency of about 100 Hz. The first control signal PZ is a signal that turns off the P-MOSFET 301 at the time of high level (one logic level: a first voltage). The second control signal NZ is a signal that turns off the N-MOSFET 302 at the time of high level (one logic level: the first voltage). Each drain of the P-MOSFET 301 and the N-MOSFET 302 is connected in common and is connected to the control port P1 (P2, P3). In this way, by supplying the logic circuit 202 (203, 204) with the clock signal D, the first control signal PZ, and the second control signal NZ appropriately, the control port P1 (P2, P3) is in a state of emergence of high level (first voltage), a state of emergence of low level (second voltage: ground), and a high impedance state. The logical circuit surrounded by a dotted line of FIG. 2 is not limited to the aforementioned configuration of connecting the inverter 303, the NAND gate 304, and the NOR gate 305. Any logical circuit can be applied as long as the same logic outputs as the logic outputs from the NAND gate 304 and the NOR gate 305 can be acquired for the conditions of the clock signal D, the first control signal PZ, and the second control signal NZ.

Description will be made specifically of a relationship among the clock signal D, the first control signal PZ, the second control signal NZ, and the control port P1, in conjunction with the operation of the logic circuit 202 (203, 204).

If both the first control signal PZ and the second control signal NZ are low level (the other logic level) (period A of FIG. 3), the outputs of the NAND gate 304 and the NOR gate 305 are varied in response to the level of the clock signal D. For example, if the clock signal D is low level, both the NAND gate 304 and the NOR gate 305 output high level. The N-MOSFET 302 is turned on and the control port P1 (P2, P3) becomes low level. On the other hand, if the clock signal D is high level, both the NAND gate 304 and the NOR gate 305 output low level. The P-MOSFET 301 is turned on and the control port P1 (P2, P3) becomes high level. Therefore, in this case, the control port P1 (P2, P3) is in a state of directly outputting high level and low level of the clock signal D.

If the first control signal PZ is high level and the second control signal NZ is low level (period B of FIG. 3), the NAND gate 304 outputs high level regardless of the changes in the level of the clock signal D. On the other hand, the output of the NOR gate 305 is varied in response to the level of the clock signal D. For example, the NOR gate 305 outputs high level when the clock signal D is low level, and the NOR gate 305 outputs low level when the clock signal D is high level. That is, if the clock signal D is low level, the P-MOSFET 301 is turned off; the N-MOSFET 302 is turned on; and the control port P1 (P2, P3) becomes low level. On the other hand, if the clock signal D is high level, both the P-MOSFET 301 and N-MOSFET 302 are turned off and the control port P1 (P2, P3) becomes the high impedance state. Therefore, in this case, the control port P1 (P2, P3) is in a state of repeating low level and the high impedance in synchronization with the clock signal D.

If the first control signal PZ is low level and the second control signal NZ is high level (period C of FIG. 3), the output of the NAND gate 304 is varied in response to the level of the clock signal D. For example, the NAND gate 304 outputs high level when the clock signal D is low level and outputs low level when the clock signal D is high level. On the other hand, the NOR gate 305 outputs low level regardless of the changes in the level of the clock signal D. That is, if the clock signal D is low level, both the P-MOSFET 301 and N-MOSFET 302 are turned off and the control port P1 (P2, P3) becomes the high impedance state. On the other hand, if the clock signal D is high level, the P-MOSFET 301 is turned on; the N-MOSFET 302 is turned off; and the control port P1 (P2, P3) becomes high level. Therefore, in this case, the control port P1 (P2, P3) is in a state of repeating low level and the high impedance in synchronization with the clock signal D.

If both the first control signal PZ and the second control signal NZ are high level (period D of FIG. 3), the NAND gate 304 outputs high level regardless of the changes in the level of the clock signal D and the NOR gate 305 outputs low level regardless of the changes in the level of the clock signal D. The P-MOSFET 301 and the N-MOSFET 302 are turned off. Therefore, in this case, the control port P1 (P2, P3) is in the high impedance state.

In this way, any LEDs 1 to 5 can be turned on/off by selectively setting the control ports P1, P2, P3 connected to the outputs of the logic circuits 202 to 204 to the states of high level, low level, or high impedance.

Although the voltage emerging at the control port P (P1, P2, P3) is indicated by H (high level), Hi-Z (high impedance), and L (low level) in FIG. 3, Hi-Z represents a level between H and L (e.g., intermediate level) for convenience of description.

A control signal generating unit 205 generates a first control signal PZ1 and a second control signal NZ1 for the logic circuit 202, a first control signal PZ2 and a second control signal NZ2 for the logic circuit 203, and a first control signal PZ3 and a second control signal NZ3 for the logic circuit 204, and supplies the logic circuits 202 to 204 with the signals.

The clock signals supplied to the logic circuits 202 to 204 are signals acquired by dividing an oscillating clock of a predetermined frequency oscillated by an oscillator 206 with a divider 207 in a predetermined manner. Specifically, if a switching circuit 208 provided on the output side of the divider 207 is switched to S1, the divided output of the divider 207 is supplied as the clock signal D to one input terminal of the NAND gate 304 and the NOR gate 305 of the logic circuits 202 and 204. In this case, the divided output of the divider 207 becomes a clock signal *D (inversion signal of the clock signal D) via an inverter 209 and is input to one input terminal of the NAND gate 304 and the NOR gate 305 of the logic circuit 203. The employed oscillator 206 can be any one of a ceramic oscillator that oscillates with a ceramic resonator, a crystal oscillator that oscillates with a crystal resonator, a RC oscillator that determines an oscillating frequency with values of a resistor and a condenser, etc. (the ceramic oscillator and the crystal oscillator will be external components of the integrated circuit 201). If the integrated circuit 201 is, for example, a microcomputer, the oscillator 206 may be used also as an oscillator that generates the operating clock of the microcomputer (in this implementations, separate oscillators are used). The divider 207 is constituted with a dividing number that can acquire the divided output of about 100 Hz. In this way, when the clock signal supplied to the logic circuits 202 to 204 is generated with hardware, the clock signals D and *D of about 100 Hz can be generated reliably and the burden can be alleviated which is imposed on the logic circuits 202 to 204 due to the software of the integrated circuit 201.

A battery remaining amount detecting unit 210 detects a remaining amount (currently charged voltage value) of a battery 211 mounted for operating an electronic device to the electronic device. For example, the battery remaining amount detecting unit 210 detects the remaining amount of the battery 211 periodically at predetermined time intervals and outputs the detected remaining amount as binarized battery remaining amount data. That is, the battery remaining amount data are updated at predetermined time intervals. For example, a well-known technology disclosed in Japanese Patent Application Laid-Open Publication No. 1996-136628 can be applied to the battery remaining amount detecting unit 210.

A battery remaining amount data storing unit 212 stores the battery remaining amount data detected by the battery remaining amount detecting unit 210 each time the data is updated. The battery remaining amount data storing unit 212 can be realized by a SRAM, etc. that are operated by supplying a power supply voltage from the battery 211. A timer 213 clocks lighting timings when the LEDs 1 to 5 are turned on/off selectively and clocks lighting durations (dynamic drive time) from the lighting timings.

A ROM 214 stores program data, table data, etc. in advance for making the integrated circuit 201 execute arithmetic processes and various operation controls. Particularly, the ROM 214 stores program data for the control signal generating unit 205 generating the first control signals PZ1 to PZ3 and the second control signals NZ1 to NZ3 appropriately in response to the remaining amount of the battery 211. The ROM 214 can be realized by any one of a mask RON onto which data are burned and fixed during the production process of the ROM itself, an EPROM where all data can be collectively erased with ultraviolet light and data can be written and read, an EEPROM (including flash ROM) where data can be erased electrically and data can be written and read, etc.

A control unit 215 decodes the program data read from the ROM 214 to execute various arithmetic processes and to output control signals for various operation controls in accordance with the decode result. Description will be made more specifically of the function of the control unit 215.

The control unit 215 has a function of generating the clock signal D of about 100 Hz with a software process in accordance with the decode result of the program data from the ROM 214. For example, if a self-running oscillation function using the oscillator 206 and the divider 207 is not provided within the integrated circuit 201 to reduce the chip area or if a port does not exist which is supplied with a made-to-run oscillating clock, the clock signal D generated by the control unit 215 is used. In this case, the programs written into the ROM 214 in advance include a program for generating the clock signal D from the control unit 215 itself as well as a program for switching the switching circuit 208 to S2. On the other hand, if the divided output of the divider 207 is used as the clock signal D, the programs written into the ROM 214 in advance include a program for prohibiting the generation of the clock signal D in the control unit 215, a program for outputting an instruction signal that instructs the oscillation and termination of the oscillator 206, and a program for switching the switching circuit 208 to S1. Since the oscillator 206 and the divider 207 are provided in this implementation, the latter programs are written into the ROM 214 in advance.

The control unit 215 has a function of reading the battery remaining amount data stored in the battery remaining amount data storing unit 212 to control the signal output from the control signal generating unit 205 such that the control signal generating unit 205 outputs the first control signals PZ1 to PZ3 and the second control signals NZ1 to NZ3 for turning on any LEDs 1 to 5 in response to the battery remaining amount data. Specifically, a minimum voltage value is set to a value when the voltage of the battery 211 is in an empty state, and a maximum voltage value is set to a value when the voltage of the battery 211 is in a fully charged state. The range between the minimum voltage value and the maximum voltage value of the battery 211 is divided into five ranges, and the battery remaining amount data at the time of $\frac{1}{5}$, $\frac{2}{5}$, $\frac{3}{5}$, and $\frac{4}{5}$ of the fully charged state of the voltage of the battery 211 are written as reference values (hereinafter, battery remaining amount reference data) into the register, etc. within the control unit 215 with the use of hardware (or, the battery remaining amount reference data may be stored in the ROM 214 as table data). The control unit 215 compares the battery remaining amount reference data with the actual battery remaining amount data stored in the battery remaining amount data storing unit 212 and outputs the instruction signal to the control signal generating unit 205 so as to output the first control signals PZ1 to PZ3 and the second control signals NZ1 to NZ3, which become high level or low level appropriately in response to the comparison result. It is assumed that the LEDs 1 to 5 are disposed on a portion of a battery pack (not shown) housing the battery 211 in the order of the LEDs 1, 2, 3, 4, and 5. For example, if the battery remaining amount data indicate less than ⅕ of the fully charged state of the battery 211, the control unit 215 supplies the control signal generating unit 205 with the instruction signal for turning on only the LED 1 (specifically, turning on and off the LED 1 repeatedly at about 100 Hz in synchronization with the clock signal D). If the battery remaining amount data indicate ⅕ or greater and less than ⅖ of the fully charged state of the battery 211, the control unit 215 supplies the control signal generating unit 205 with the instruction signal for turning on the LEDs 1 and 2 (specifically, turning on and off the LEDs 1 and 2 repeatedly in a complementary manner at about 100 Hz in synchronization with the clock signal D). If the battery remaining amount data indicate ⅖ or greater and less than ⅗ of the fully charged state of the battery 211, the control unit 215 supplies the control signal generating unit 205 with the instruction signal for turning on the LEDs 1 to 3 (specifically, turning on and off the LEDs 1 to 3 repeatedly at about 100 Hz in synchronization with the clock signal D). If the battery remaining amount data indicate ⅗ or greater and less than ⅘ of the fully charged state of the battery 211, the control unit 215 supplies the control signal generating unit 205 with the instruction signal for turning on the LEDs 1 to 4 (specifically, turning on and off the LEDs 1 to 4 repeatedly at about 100 Hz in synchronization with the clock signal D). If the battery remaining amount data indicate greater than ⅘ of the fully charged state of the battery 211, the control unit 215 supplies the control signal generating unit 205 with the instruction signal for turning on all the LEDs 1 to 5 (specifically, turning on and off the LEDs 1 to 5 repeatedly at about 100 Hz in synchronization with the clock signal D).

<<Operation of Light Emitting Device Driving Apparatus>>

Figure 4:
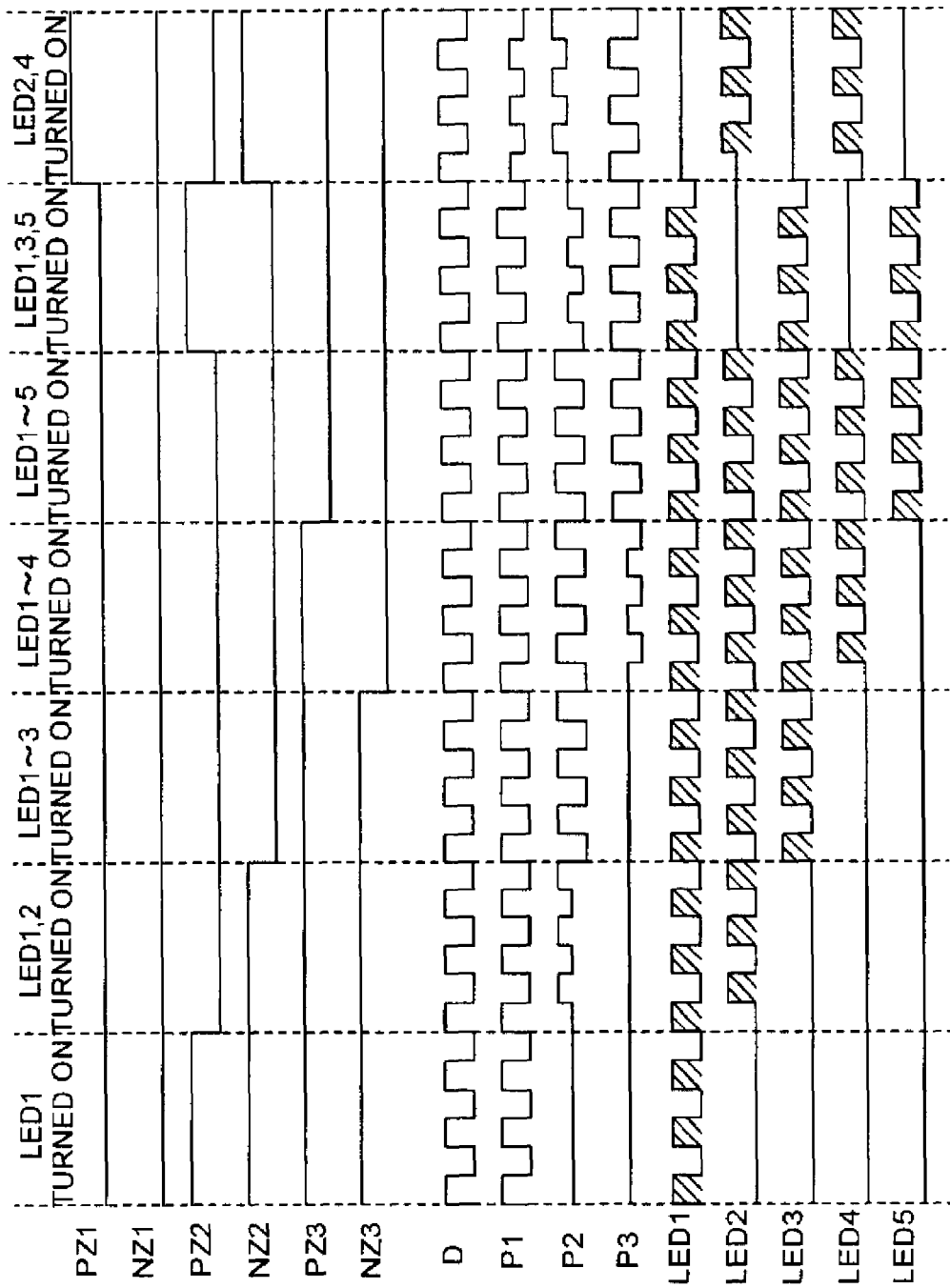
FIG. 4 is a time chart of the overall operation of the first implementation.

With reference to FIGS. 1 to 4, description will be made of the operation of the light emitting device driving apparatus. FIG. 4 is a time chart of operation waveforms in relevant portions of FIG. 1. At the top of the page of FIG. 4, sections divided by vertical dotted lines are sections for turning on the shown LEDs.

When the battery pack (not shown) housing the battery 211 is mounted to the main body of and electrically connected to an electronic device (e.g., notebook personal computer), a voltage charged in the battery 211 is supplied to the integrated circuit 201. Specifically, the charged voltage is supplied to the integrated circuit 201 as the power supply voltage VDD for operating each component within the integrated circuit 201 and, particularly, the voltage charged in the battery 211 is supplied as analog information to the battery remaining amount detecting unit 210.

The integrated circuit 201 is reset until the power supply voltage VDD is raised to a value for normally operating each component within the integrated circuit 201. The reset of the integrated circuit 201 is subsequently released and the control operation can be executed for turning on/off the LEDs 1 to 5 by supplying each component with the power supply voltage VDD raised to the steady state. The control operation for turning on/off the LEDs 1 to 5 is achieved by decoding the program data read from the ROM 214 with the control unit 215 and by supplying appropriate components with the control signals and instruction signals output from the control unit 215 as a result of the decoding. An oscillator (not shown) provided separately from the oscillator 206 starts operating in accordance with the input of the power supply voltage VDD, and the control unit 215 is operated by supplying the operating clock from the oscillator.

First, the control unit 215 outputs the instruction signal for starting the oscillation of the oscillator 206. In this way, the oscillator 206 starts oscillating at the own oscillating frequency. The oscillating clock output from the oscillator 206 is divided by the divider 207 in a predetermined manner. On the other hand, the control unit 215 outputs the instruction signal for switching the switching circuit 208 to S1. In this way, the switching circuit 208 is switched to S1. Therefore, the divided output of about 100 Hz acquired from the divider 207 is supplied as the clock signal D to the logic circuits 202 and 204 via the switching circuit 208. The clock signal D is inverted by the inverter 209 to be the clock signal *D and the clock signal *D is supplied to the logic circuit 203.

The control unit 215 supplies the battery remaining amount detecting unit 210 with the instruction signal for checking the remaining amount of the battery 211. In this way, the battery remaining amount detecting unit 210 detects the remaining amount of the battery 211, for example, at a certain sampling frequency, and the detection result is output as the binarized battery remaining amount data. The battery remaining amount data are data updated at the certain sampling frequency, and the battery remaining amount data storing unit 212 overwrites the battery remaining amount data to store the updated data. The control unit 215 reads the battery remaining amount data currently stored in the battery remaining amount data storing unit 212 to compare with the battery remaining amount reference data preliminarily prepared for indicating that the remaining amount of the battery 211 is ⅕, ⅖, ⅗, or ⅘ of the fully charged state. In response to the result of the comparison between the battery remaining amount data read from the battery remaining amount data storing unit 212 and the battery remaining amount reference data preliminarily prepared, the control unit 215 outputs the instruction signal such that the control signal generating unit 205 can output the first control signals PZ1 to PZ3 and the second control signals NZ1 to NZ3 at the logic levels that can turn on/off any LEDs 1 to 5 appropriately.

For example, when the control unit 215 compares the battery remaining amount data with the battery remaining amount reference data, if it is determined as a result that the remaining amount of the battery 211 is less than ⅕ of the fully charged state, the control unit 215 supplies the control signal generating unit 205 with the instruction signal for turning on/off only the LED 1 at the frequency of the clock signal D. In accordance with the instruction signal, the control signal generating unit 205 supplies the logic circuit 202 with the low-level first control signal PZ1 and the low-level second control signal NZ1. The control signal generating unit 205 supplies the logic circuit 203 with the high-level first control signal PZ2 and the high-level second control signal NZ2. The control signal generating unit 205 supplies the logic circuit 204 with the high-level first control signal PZ3 and the high-level second control signal NZ3. As is apparent from the circuit diagram of FIG. 2 and the time chart of FIG. 3, the clock signal D emerges directly at the control port P1. The control ports P2 and P3 become the high impedance states. Therefore, only the LED 1 is turned on only when the control port P1 becomes high level (diagonal lines show the time when the LED is turned on). In other words, only the LED 1 is turned on/off repeatedly at a frequency of about 100 Hz that changes the control port P1 to high level and low level. When the LED 1 is turned on/off at about 100 Hz, the LED 1 looks like turned on continuously to the human naked eye. Therefore, it can be checked that the remaining amount of the battery 211 is less than 1/5 of the fully charged state.

When the control unit 215 compares the battery remaining amount data with the battery remaining amount reference data, if it is determined as a result that the remaining amount of the battery 211 is 1/5 or greater and less than 2/5 of the fully charged state, the control unit 215 supplies the control signal generating unit 205 with the instruction signal for turning on/off the LEDs 1 and 2 at the frequency of the clock signal D. In accordance with the instruction signal, the control signal generating unit 205 supplies the logic circuit 202 with the low-level first control signal PZ1 and the low-level second control signal NZ1. The control signal generating unit 205 supplies the logic circuit 203 with the low-level first control signal PZ2 and the high-level second control signal NZ2. The control signal generating unit 205 supplies the logic circuit 204 with the high-level first control signal PZ3 and the high-level second control signal NZ3. As is apparent from the circuit diagram of FIG. 2 and the time chart of FIG. 3, the control port P1 becomes high level when the clock signal D is high level and becomes low level when the clock signal D is low level. The control port P2 becomes the high impedance state when the clock signal D is high level and becomes high level when the clock signal D is low level. The control port P3 becomes the high impedance state. Since the control ports P2 and P3 are the high impedance states when the control port P1 is high level, only the LED 1 is conductive and is turned on. On the other hand, since the control port P2 is high level and the control port P3 is the high impedance state when the control port P1 is low level, only the LED 2 is conductive and is turned on. In other words, the LEDs 1 and 2 are turned on/off repeatedly in a complementary manner at a frequency of about 100 Hz that changes the levels of the control ports P1 and P2. When the LEDs 1 and 2 are turned on/off at about 100 Hz in a complementary manner, the LEDs 1 and 2 look like turned on continuously to the human naked eye. Therefore, it can be checked that the remaining amount of the battery 211 is 1/5 or greater and less than 2/5 of the fully charged state.

When the control unit 215 compares the battery remaining amount data with the battery remaining amount reference data, if it is determined as a result that the remaining amount of the battery 211 is 2/5 or greater and less than 3/5 of the fully charged state, the control unit 215 supplies the control signal generating unit 205 with the instruction signal for turning on/off the LEDs 1 to 3 at the frequency of the clock signal D. In accordance with the instruction signal, the control signal generating unit 205 supplies the logic circuit 202 with the low-level first control signal PZ1 and the low-level second control signal NZ1. The control signal generating unit 205 supplies the logic circuit 203 with the low-level first control signal PZ2 and the low-level second control signal NZ2. The control signal generating unit 205 supplies the logic circuit 204 with the high-level first control signal PZ3 and the high-level second control signal NZ3. As is apparent from the circuit diagram of FIG. 2 and the time chart of FIG. 3, the control port P1 becomes high level when the clock signal D is high level and becomes low level when the clock signal D is low level. The control port P2 becomes low level when the clock signal D is high level and becomes high level when the clock signal D is low level. The control port P3 becomes the high impedance state. Since the control port P2 is low level and the control port P3 is the high impedance state when the control port P1 is high level, the LEDs 1 to 3 are conductive and are turned on. On the other hand, since the control port P2 is high level and the control port P3 is the high impedance state when the control port P1 is low level, only the LED 2 is conductive and is turned on. In other words, the LEDs 1 and 3 are turned on/off repeatedly in a complementary manner at a frequency of about 100 Hz that changes the levels of the control ports P1 and P2, and the LED 2 is turned on/off repeatedly in a complementary manner relative to the LEDs 1 and 3. When the LEDs 1 to 3 are turned on/off at about 100 Hz in a complementary manner, the LEDs 1 to 3 look like turned on continuously to the human naked eye. Therefore, it can be checked that the remaining amount of the battery 211 is 2/5 or greater and less than 3/5 of the fully charged state.

When the control unit 215 compares the battery remaining amount data with the battery remaining amount reference data, if it is determined as a result that the remaining amount of the battery 211 is 3/5 or greater and less than 4/5 of the fully charged state, the control unit 215 supplies the control signal generating unit 205 with the instruction signal for turning on/off the LEDs 1 to 4 at the frequency of the clock signal D. In accordance with the instruction signal, the control signal generating unit 205 supplies the logic circuit 202 with the low-level first control signal PZ1 and the low-level second control signal NZ1. The control signal generating unit 205 supplies the logic circuit 203 with the low-level first control signal PZ2 and the low-level second control signal NZ2. The control signal generating unit 205 supplies the logic circuit 204 with the high-level first control signal PZ3 and the low-level second control signal NZ3. As is apparent from the circuit diagram of FIG. 2 and the time chart of FIG. 3, the control port P1 becomes high level when the clock signal D is high level and becomes low level when the clock signal D is low level. The control port P2 becomes low level when the clock signal D is high level and becomes high level when the clock signal D is low level. The control port P3 becomes the high impedance state when the clock signal D is high level and becomes low level when the clock signal D is low level. Since the control port P2 is low level and the control port P3 is the high impedance state when the control port P1 is high level, the LEDs 1 to 3 are conductive and are turned on. On the other hand, since the control port P2 is high level and the control port P3 is low level when the control port P1 is low level, the LEDs 2 and 4 are conductive and are turned on. In other words, the LEDs 1 and 3 are turned on/off repeatedly in a complementary manner at a frequency of about 100 Hz that changes the levels of the control ports P1 and P2, and the LEDs 2 and 4 are turned on/off repeatedly in a complementary manner relative to the LEDs 1 and 3. When the LEDs 1 and 3 and the LEDs 2 and 4 are turned on/off at about 100 Hz in a complementary manner, the LEDs 1 to 4 look like turned on continuously to the human naked eye. Therefore, it can be checked that the remaining amount of the battery 211 is 3/5 or greater and less than 4/5 of the fully charged state.

When the control unit 215 compares the battery remaining amount data with the battery remaining amount reference data, if it is determined as a result that the remaining amount of the battery 211 is equal to or greater than 4/5 of the fully charged state, the control unit 215 supplies the control signal generating unit 205 with the instruction signal for turning on/off all the LEDs 1 to 5 at the frequency of the clock signal D. In accordance with the instruction signal, the control signal generating unit 205 supplies the logic circuit 202 with the low-level first control signal PZ1 and the low-level second control signal NZ1. The control signal generating unit 205 supplies the logic circuit 203 with the low-level first control signal PZ2 and the low-level second control signal NZ2. The control signal generating unit 205 supplies the logic circuit 204 with the low-level first control signal PZ3 and the low-level second control signal NZ3. As is apparent from the circuit diagram of FIG. 2 and the time chart of FIG. 3, the control ports P1 and P3 become high level when the clock signal D is high level and become low level when the clock signal D is low level. The control port P2 becomes low level when the clock signal D is high level and becomes high level when the clock signal D is low level. Since the control port P2 is low level and the control port P3 is high level when the control port P1 is high level, the LEDs 1, 3, 5 are conductive and are turned on. On the other hand, since the control port P2 is high level and the control port P3 is low level when the control port P1 is low level, the LEDs 2 and 4 are conductive and are turned on. In other words, the LEDs 1, 3, 5 are turned on/off repeatedly in a complementary manner at a frequency of about 100 Hz that changes the levels of the control ports P1 and P2, and the LEDs 2 and 4 are turned on/off repeatedly in a complementary manner relative to the LEDs 1, 3, 5. When the LEDs 1, 3, 5 and the LEDs 2 and 4 are turned on/off at about 100 Hz in a complementary manner, all the LEDs 1 to 5 look like turned on continuously to the human naked eye. Therefore, it can be checked that the remaining amount of the battery 211 is equal to or greater than ⅘ of the fully charged state.

After the reset of the integrate circuit 201 is released, the control unit 215 outputs to the timer 213 the instruction signal to start clocking. The timer 213 is triggered by the instruction signal to start clocking and supplies the controlling signal 215 with a clocking start signal. When the timer 213 clocks a first time period (e.g., three second) from the start of the clocking, the timer 213 supplies the controlling signal 215 with a clocking end signal (overflow signal). When the clocking end signal is supplied from the timer 213, the control unit 215 will output to the timer 213 the instruction signal to start clocking again after a second time period (e.g., five seconds) counted by an internal counter etc. has elapsed. That is, the timer 213 clocks three seconds periodically at intervals of five seconds, for example. The control unit 215 fetches the battery remaining amount data stored in the battery remaining amount data storing unit 212 at the timing before the timer 213 is supplied with the instruction signal. Particularly, if the timer periodically clocks the first time period, the control unit 215 fetches the battery remaining amount data stored in the battery remaining amount data storing unit 212 during the second time period starting when the clocking start signal is supplied from the timer 213 and ending when the timer 213 is supplied with the instruction signal. When the timer 213 clocks the first time period, the control unit 205 supplies the control signal generating unit 205 with the instruction signal corresponding to the battery remaining amount data, which has been fetched immediately before the timer clocks the first time period. Since the control unit 205 uses the timer 213 to monitor the timing when the LEDs 1 to 5 start lighting (clocking start signal) and the duration of the lighting of the LEDs 1 to 5 (clocking end signal), the LEDs 1 to 5 periodically perform the indicator display in response to the remaining amount of the battery 211 during each first time period from the output of the clocking start signal to the output of the clocking end signal of the timer 123. The clocking method of the timer 213 for the indicator display of the LEDs 1 to 5 is an example for describing the first implementation and is not a limitation.

It has been described that five types of status display can be achieved in the first implementation by appropriately setting the three control ports P1 to P3 to any states of high level, low level, and high impedance to perform the indicator display of the five LEDs 1 to 5. However, if the LEDs 1 to 5 can perform other types of status display in addition to the five types of status display, various states including the remaining amount of the battery 211 can be checked in detail. For example, it is desirable to be able to perform display other than the remaining amount display when indicating that it is the replacement timing for the battery 211 because the remaining amount of the battery 211 is little and when the abnormality of the battery 211 is found because the voltage supply from the battery 211 mounted to the electronic device is unstable.

If the indication is achieved when it is the replacement timing for the battery 211 because the remaining amount of the battery 211 is little, in the control unit 215, battery remaining reference data are further written into an internal register etc. for indicating that the remaining amount of the battery 211 is less than ⅕ of the fully charged state (e.g., data indicating that the remaining amount of the battery 211 is 1/10 of the fully charged state). When the control unit 215 compares the battery remaining amount data with the battery remaining amount reference data, if it is determined as a result that the remaining amount of the battery 211 is less than 1/10 of the fully charged state, the control unit 215 supplies the control signal generating unit 205 with the instruction signal for turning on/off the odd-numbered LEDs 1, 3, 5 at the frequency of the clock signal D during each first time period clocked by the timer 213. In accordance with the instruction signal, the control signal generating unit 205 supplies the logic circuit 202 with the low-level first control signal PZ1 and the low-level second control signal NZ1. The control signal generating unit 205 supplies the logic circuit 203 with the high-level first control signal PZ2 and the low-level second control signal NZ2. The control signal generating unit 205 supplies the logic circuit 204 with the low-level first control signal PZ3 and the low-level second control signal NZ3. As is apparent from the circuit diagram of FIG. 2 and the time chart of FIG. 3, the control ports P1 and P3 become high level when the clock signal D is high level and become low level when the clock signal D is low level. The control port P2 becomes low level when the clock signal D is high level and becomes the high impedance state when the clock signal D is low level. Since the control port P2 is low level and the control port P3 is high level when the control port P1 is high level, the LEDs 1, 3, 5 are conductive and are turned on. On the other hand, since the control port P2 is the high impedance state and the control port P3 is low level when the control port P1 is low level, all the LEDs 1 to 5 are turned off. In other words, the LEDs 1, 3, 5 are turned on/off repeatedly in a complementary manner at a frequency of about 100 Hz that changes the levels of the control ports P1 to P3. When the LEDs 1, 3, 5 are turned on/off at about 100 Hz in a complementary manner, the LEDs 1, 3, 5 look like turned on continuously to the human naked eye. Therefore, it can be checked that the remaining amount of the battery 211 is less than 1/10 of the fully charged state and that it is the replacement timing for the battery 211.

On the other hand, in the latter case, i.e., if the indication is achieved when the abnormality of the battery 211 is found because the voltage supply from the battery 211 mounted to the electronic device is unstable, program data are written into the ROM 214 in advance for the control unit 215 monitoring the degree of the change in the battery remaining amount data read from the battery remaining amount data storing unit 212 at each second time period, along with reference data used when the control unit 215 determines that the abnormality of the battery 211 is found. When the control unit 215 monitors the degree of the change in the battery remaining amount data, if it is determined as a result that the abnormality of the battery 211 is found, the control unit 215 supplies the control signal generating unit 205 with the instruction signal for turning on/off the even-numbered LEDs 2, 4 at the frequency of the clock signal D during each first time period clocked by the timer 213. In accordance with the instruction signal, the control signal generating unit 205 supplies the logic circuit 202 with the high-level first control signal PZ1 and the low-level second control signal NZ1. The control signal generating unit 205 supplies the logic circuit 203 with the low-level first control signal PZ2 and the high-level second control signal NZ2. The control signal generating unit 205 supplies the logic circuit 204 with the low-level first control signal PZ3 and the low-level second control signal NZ3. As is apparent from the circuit diagram of FIG. 2 and the time chart of FIG. 3, the control port P1 becomes the high impedance state when the clock signal D is high level and becomes low level when the clock signal D is low level. The control port P3 becomes high level when the clock signal D is high level and becomes low level when the clock signal D is low level. Since the control ports P1 and P2 are the high impedance states when the control port P3 is high level, all the LEDs 1 to 5 are turned off. On the other hand, since the control port P1 is low level and the control port P2 is high level when the control port P3 is low level, the LEDs 2, 4 are conductive and are turned on. In other words, the LEDs 2, 4 are turned on/off repeatedly in a complementary manner at a frequency of about 100 Hz that changes the levels of the control ports P1 to P3. When the LEDs 2, 4 are turned on/off at about 100 Hz in a complementary manner, the LEDs 2, 4 look like turned on continuously to the human naked eye. Therefore, it can be checked that the abnormality exists in the battery 211.

The case of turning on the LEDs 1, 3, 5 or the LEDs 2, 4 is not limited to the above description. However, since the indicator display of the remaining amount of the battery 211 is performed with the use of the LEDs 1 to 5 when the electronic device is operated normally, the display performed by turning on the LEDs 1, 3, 5 or the LEDs 2, 4 is effective when notifying a user of the status of the electronic device urgently, etc. When the 1, 3, 5 or the LEDs 2, 4 are turned on, as compared to the case of the indicator display of the LEDs 1 to 5, at least one of the first time period clocked by the timer 213 and the second time period counted by the control unit 215 may be changed to facilitate identification of the display in the former case and the latter case.

As described above, according to the first implementation, seven types of display status can be generated by connecting the five LEDs 1 to 5 to the three control ports P1 to P3 as described above to perform the dynamic drive appropriately. The indicator display can be performed effectively when the remaining amount of the battery 211 is less than 1/5, 1/5 or greater and less than 2/5, 2/5 or greater and less than 3/5, 3/5 or greater and less than 4/5, and greater than 4/5 by arranging the LEDs 1 to 5 in the order of the LED 1, the LED 2, the LED 3, the LED 5, and the LED 4.

==Second Implementation==

Figure 5:
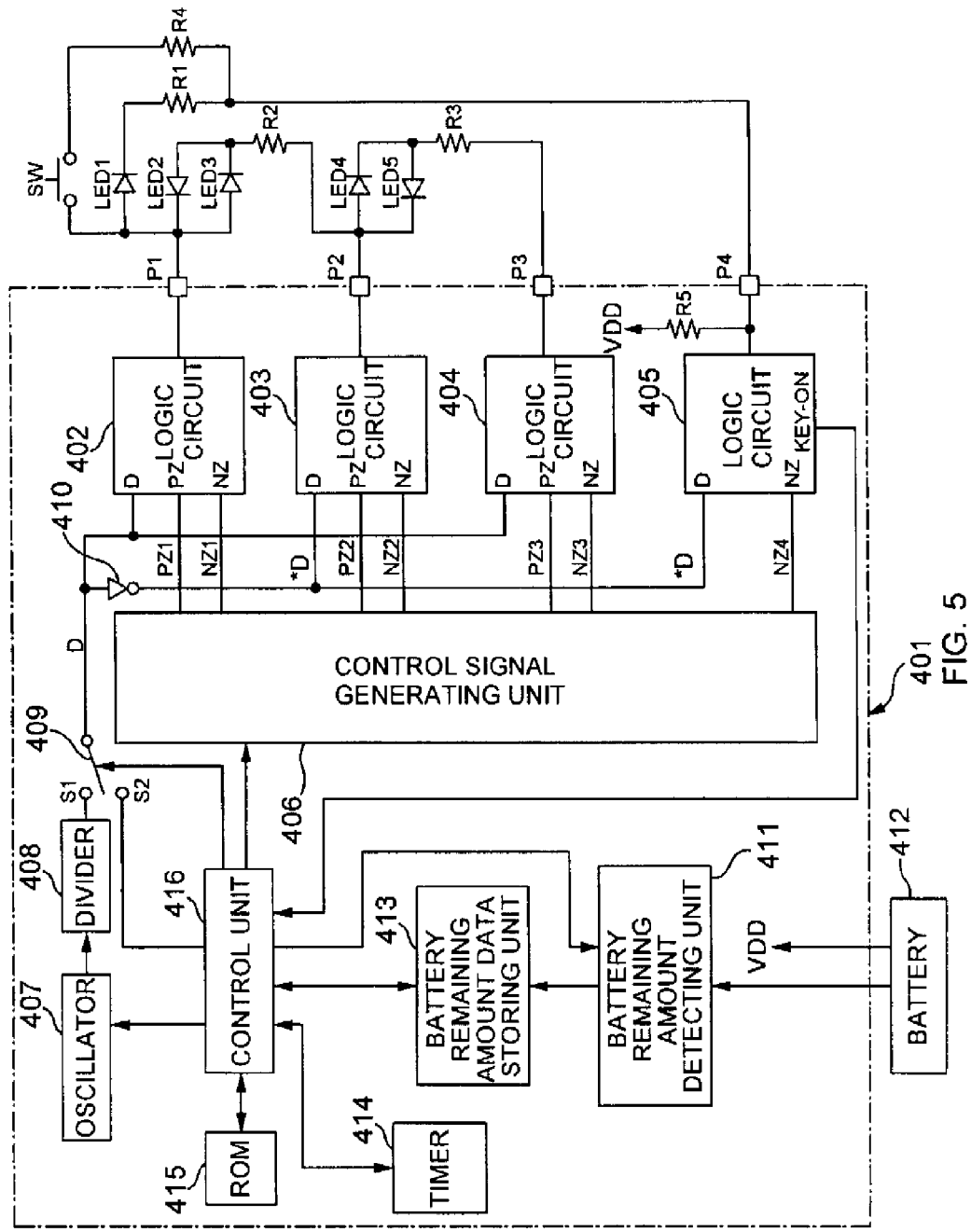
FIG. 5 is a circuit block diagram of second implementation.

With reference to FIG. 5, description will be made of another implementation of the light emitting device drive controller and the light emitting device driving apparatus of the present invention. FIG. 5 is a circuit block diagram of another implementation of the light emitting device driving apparatus of the present invention. In FIG. 5, a configuration surrounded by a dot-and-dash line on the page shows the light emitting device drive controller, which is constituted by an integrated circuit, for example, a microcomputer with a controlling function of turning on/off light emitting devices and which is disposed on a first printed board (not shown) for driving the light emitting devices. On the other hand, a rightward configuration not surrounded by the dot-and-dash line on the page is external components of the integrated circuit, which is disposed on a second printed board for display (not shown: e.g., a board within a display). In the implementation of the following description, as is the case with the first implementation, the light emitting device drive controller and the light emitting device driving apparatus of the present invention are used for the purpose of performing indicator display of a remaining amount level of a battery mounted to an electronic device for supplying a power supply voltage to the electronic device, for example.

<<External Configuration of Integrated Circuit>>

An integrated circuit 401 includes control ports P1, P2, P3, P4 for externally connecting the external components, i.e., LEDs 1 to 5, a limiting resistor R1 that limits a current of the LED 1, a limiting resistor R2 that limits currents of the LEDs 2 and 3, a limiting resistor R3 that limits currents of the LEDs 4 and 5, a switch SW, and a limiting resistor R4 that limits currents when the switch SW is closed. Among the LEDs 1 to 5 that are light emitting devices, the LED 1 corresponds to a single light emitting device. The LEDs 2 and 3 are connected in parallel in the opposite directions and correspond to a first light emitting device group. The LEDs 4 and 5 are connected in parallel in the opposite directions and correspond to a second light emitting device group. The control ports P1 to P4 correspond to first to fourth ports, respectively. The switch SW is operated when a user checks the remaining amount of the battery described later and is configured to be closed (ON) only during the operation and to be opened (OFF) when not operated.

Specifically, the control port P1 is connected to a cathode of the LED 2 and an anode of the LED 3, which are one end of the first light emitting device group. The control port P1 is also connected to an anode of the LED 1 and one end of the switch SW.

The control port P2 is connected to an anode of the LED 2 and a cathode of the LED 3, which are the other end of the first light emitting device group, via the limiting resistor R2. The control port P2 is also connected to an anode of the LED 4 and a cathode of the LED 5, which are one end of the second light emitting device group.

The control port P3 is connected to a cathode of the LED 4 and an anode of the LED 5, which are the other end of the second light emitting device group, via the limiting resistor R3.

The control port P4 is connected to a cathode of the LED 1 via the limiting resistor R1 and is connected to the other end of the switch SW via the limiting resistor R4. In the integrated circuit 401, the control port P4 is pulled up via a pull-up resistor R5 to a power supply voltage VDD for the integrated circuit 401. When comparing the resistance values of the limiting resistor R4 and the pull-up resistor R5, the resistance value of the pull-up resistor R5 is extremely smaller than the resistance value of the limiting resistor R4 (e.g., R5=300 kΩ, R4=10 kΩ). In this way, when the switch SW is opened, the control port P4 is pulled up be the pull-up resistor R5 to be high level continuously. On the other hand, when the switch SW is closed, one end of the switch SW is grounded by an element (not shown) that has predetermined impedance within a logic circuit 402. Although a voltage emerging at the control port P4 is a value of the power supply VDD divided by the resistance values R5 and R4, since R5>>R4, it is recognized that the control port P4 is low level. The pulling up of the control port P4 may be achieved outside of the integrated circuit 401.

<<Internal Configuration of Integrated Circuit>>

The control ports P1 to P4 are connected to output terminals of logic circuits 402 to 405 for selectively turning on/off the LEDs 1 to 5. The configuration and operation of the logic circuits 402 to 404 are the same as the logic circuit 202 to 204 (FIG. 1) provided in the first implementation. Since the configuration and operation of the logic circuits 202 to 204 has been described with reference to FIGS. 2 and 3, the configuration and operation of the logic circuits 402 to 404 will not be described. Although the control ports P1 to P3 are set to be high level, low level, or high impedance, the control port P4 is set to a low level or high level state only, as described later. Therefore, a configuration different from the logic circuits 402 to 404 is employed for the logic circuit 405 in this implementation.

Figure 6:
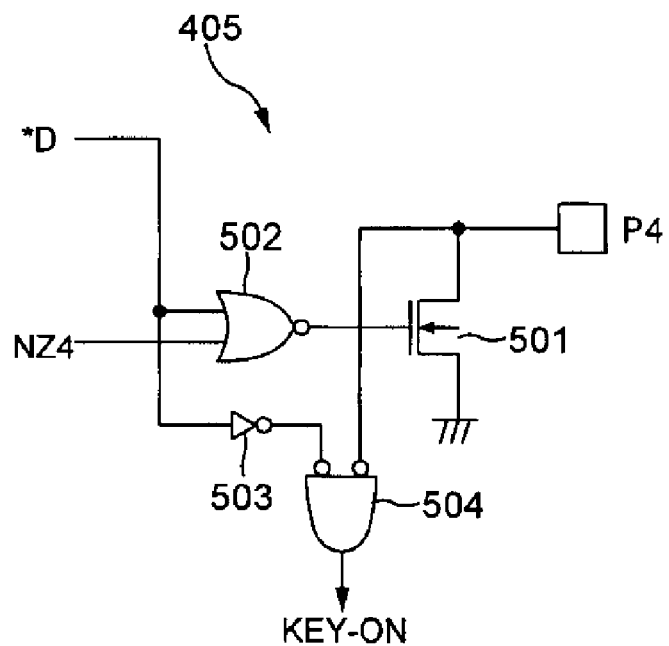
FIG. 6 is a circuit diagram of a configuration example of a logic circuit used in the second implementation.
Figure 7:
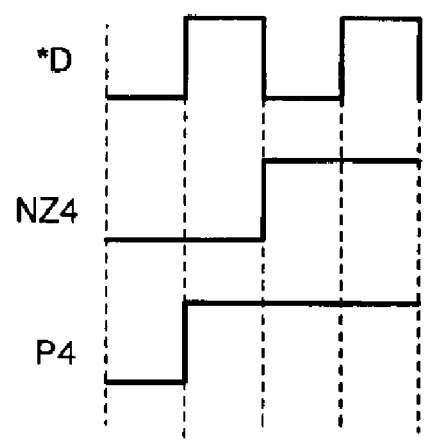
FIG. 7 is a time chart of the operation of the logic circuit of FIG. 6.

With reference to FIGS. 6 and 7, description will be made of the configuration and operation of the logic circuit 405. FIG. 6 is a circuit diagram of an example of the logic circuit 405. FIG. 7 is a time chart of the operation of the logic circuit 405.

The logic circuit 405 is composed of an N-MOSFET 501 and a logical circuit (NOR gates 502, 504 and inverter 503). Specifically, the drain of the N-MOSFET 501 is connected to the control port P4; the source is grounded; and the gate is connected to the output of the NOR gate 502. The clock signal *D is supplied to one input terminal or the NOR gate 502 and a second control signal NZ4 is supplied to the other input terminal of the NOR gate 502. One input terminal of the NOR gate 504 is connected to the control port P4 and the drain of the N-MOSFET 501 and the other input terminal of the NOR gate 504 is supplied with the clock signal *D via the inverter 503.

Description will be made of the operation of the logic circuit 405. For convenience of description, it is assumed that the switch SW of FIG. 1 has been turned off (closed) and that the control port P4 is pulled up to the power supply VDD by the pull-up resistor of FIG. 1.

If the second control signal NZ4 is low level, the NOR gate 502 outputs the inverted level of the clock signal *D. Therefore, if the clock signal *D is low level, since the output of the NOR gate 502 is high level, the N-MOSFET 501 is turned on and the control port P4 is pulled down to ground to be low level. If the clock signal *D is high level, since the output of the NOR gate 502 is low level, the N-MOSFET 501 is turned off and the control port P4 is pulled up continuously to be high level. On the other hand, if the second control signal NZ4 is high level, the output of the NOR gate 502 is fixed to be low level regardless of the changes in the level of the clock signal *D. Therefore, the N-MOSFET 501 is turned off to generate the high impedance state between the drain and the source of the N-MOSFET 501 and, therefore, the control port P4 is pulled up continuously to be high level. When the switch SW is turned off, since the control port P4 is high level, the output of the NOR gate 504 is fixed to be low level. That is, a KEY-ON signal is output from the logic circuit 405 while maintaining the low level indicating that the switch SW is turned off.

By the way, in the state of determining whether the switch SW is turned on or not, i.e., in the standby state for turning on any LEDs 1 to 5, the clock signal D is generated; the second control signal NZ4 is high level; and the N-MOSFET 501 is turned off. In this state, when the switch SW is turned on (closed) from the OFF state, the control port P4 becomes a voltage value divided by the limiting resistor R4 and the pull-up resistor R5 to be low level. In this way, the clock signal *D is output as the KEY-ON signal directly from the NOR gate 504.

Although the circuit of FIG. 6 is employed as the logic circuit 405 in this implementation, this is not a limitation. For example, the logic circuit 405 may have the same configuration as the logic circuits 402 to 404. In this case, although the logic circuit 405 is supplied with the clock signal *D, the first control signal PZ4, and the second control signal NZ4, the first control signal PZ4 may be maintained to be high level continuously and the second control signal NZ4 may be maintained to be low level continuously. In this way, since different configurations do not have to be employed for the logic circuit 402 to 405 when the integrated circuit 401 is developed, the development burden can be alleviated.

A control signal generating unit 406 generates a first control signal PZ1 and a second control signal NZ1 for the logic circuit 402, a first control signal PZ2 and a second control signal NZ2 for the logic circuit 403, a first control signal PZ3 and a second control signal NZ3 for the logic circuit 404, and the second control signal NZ 4 for the logic circuit 405 and supplies the logic circuits 402 to 404 with the signals.

The clock signals supplied to the logic circuits 402 to 405 are signals acquired by dividing an oscillating clock of a predetermined frequency oscillated by an oscillator 407 with a divider 408 in a predetermined manner. Specifically, if a switching circuit 409 provided on the output side of the divider 408 is switched to S1, the divided output of the divider 408 is supplied as the clock signal D to one input terminal of the NAND gate 304 and the NOR gate 305 of the logic circuits 402 and 404. In this case, the divided output of the divider 408 becomes the clock signal *D (inversion signal of the clock signal D) via an inverter 410, is input to one input terminal of the NAND gate 304 and the NOR gate 305 of the logic circuit 403, and is supplied to one input terminal of the NOR gate of the logic circuit 405 and the inverter 503. The employed oscillator 407 can be any one of a ceramic oscillator that oscillates with a ceramic resonator, a crystal oscillator that oscillates with a crystal resonator, a RC oscillator that determines an oscillating frequency with values of a resistor and a condenser, etc. (the ceramic oscillator and the crystal oscillator will be external components of the integrated circuit 401). If the integrated circuit 401 is, for example, a microcomputer, the oscillator 407 may be used also as an oscillator that generates the operating clock of the microcomputer (in this implementations, separate oscillators are used). The divider 408 is constituted with a dividing number that can acquire the divided output of about 100 Hz. In this way, when the clock signal supplied to the logic circuits 402 to 405 is generated with hardware, the clock signals D and *D of about 100 Hz can be generated reliably and the burden can be alleviated which is imposed on the logic circuits 402 to 405 due to the software of the integrated circuit 401.

A battery remaining amount detecting unit 411 detects a remaining amount (currently charged voltage value) of a battery 412 mounted for operating an electronic device to the electronic device at a sampling frequency determined in advance. For example, the battery remaining amount detecting unit 411 detects the remaining amount of the battery 412 periodically and outputs the detected remaining amount as binarized battery remaining amount data. That is, the battery remaining amount data are updated periodically. For example, a well-known technology disclosed in Japanese Patent Application Laid-Open Publication No. 1996-136626 can be applied to the battery remaining amount detecting unit 411 as is the case with the first implementation.

A battery remaining amount data storing unit 413 stores the battery remaining amount data detected by the battery remaining amount detecting unit 411 each time the data is updated. The battery remaining amount data storing unit 413 can be realized by a SRAM, etc. that are operated by supplying a power supply voltage from the battery 412. A timer 414 clocks lighting durations (dynamic drive time) of the LEDs 1 to 5 corresponding to the first control signals PZ1 to PZ3 and the second control signals NZ1 to NZ4 based on the KEY-ON signal changed at 100 Hz when the switch SW is turned on.

A ROM 415 stores program data, table data, etc. in advance for making the integrated circuit 401 execute arithmetic processes and various operation controls. Particularly, the ROM 415 stores program data for the control signal generating unit 406 generating the first control signals PZ1 to PZ3 and the second control signals NZ1 to NZ3 appropriately in response to the remaining amount of the battery 412. The ROM 415 can be realized by any one of a mask ROM onto which data are burned and fixed during the production process of the ROM itself, an EPROM where all data can be collectively erased with ultraviolet light and data can be written and read, an EEPROM (including flash ROM) where data can be erased electrically and data can be written and read, etc.

A control unit 416 decodes the program data read from the ROM 415 to execute various arithmetic processes and to output control signals for various operation controls in accordance with the decode result. Description will be made more specifically of the function of the control unit 416.

The control unit 416 has a function of generating the clock signal D of about 100 Hz with a software process in accordance with the decode result of the program data from the ROM 315. For examples if a self-running oscillation function using the oscillator 407 and the divider 408 is not provided within the integrated circuit 401 to reduce the chip area or if a port does not exist which is supplied with a made-to-run oscillating clock, the clock signal D generated by the control unit 416 is used. In this case, the programs written into the ROM 415 in advance include a program for generating the clock signal D from the control unit 215 itself as well as a program for switching the switching circuit 409 to S2. On the other hand, if the divided output of the divider 408 is used as the clock signal D, the programs written into the ROM 415 in advance include a program for prohibiting the generation of the clock signal D in the control unit 416, a program for outputting an instruction signal that instructs the oscillation and termination of the oscillator 407, and a program for switching the switching circuit 409 to S1. Since the oscillator 407 and the divider 408 are provided in this implementation, the latter programs are written into the ROM 214 in advance.

When all the LEDs 1 to 5 must be turned off continuously (FIG. 8: standby state for determining that the switch SW is turned on), the control unit 416 controls the control signal generating unit 406 such that all the LEDs 1 to 5 are turned off continuously based on the output of the logic circuits 402 to 405. Specifically, the control port P1 is synchronized with the clock signal D to be in the state of changing to high level or low level, and the control ports P2 and P3 are the high impedance states. Therefore, when the switch SW is pressed down and is tuned on to check the remaining amount of the buttery 412 (the high level period of the switch SW of FIG. 8), since a voltage value divided by the limiting resistor R4 and the pull-up resistor R5 emerges at the control port P4, the level of the control port P4 is changed to high level (low level) as the control port P1 changes to high level (low level). Therefore, when the switch SW is turned on, the KEY-ON signal becomes high level when the control port P4 is low level and becomes low level when the control port P4 is high level. In the integrated circuit 401, this KEY-ON signal is supplied to the control unit 416 as an interruption request signal for turning on any LEDs 1 to 5 that indicate the remaining amount of the battery 412.

During the period when the switch SW is turned on, the control unit 416 detects whether or not the KEY-ON signal becomes high level consecutively (e.g., for three times) at a plurality of timings when the control port P4 becomes low level. If the control unit 416 detects that the KEY-ON signal becomes high level consecutively, the control unit 416 determines that the switch SW is turned on. The control unit 416 detects the consecutive high levels of the KEY-ON signal to determine that the switch SW is turned on so as not to consider a chattering state, such as pressing down the switch SW accidentally for a moment, as "ON". Although FIG. 8 describes that the KEY-ON signal becomes high level for three times consecutively during the period when the switch SW is turned on, this is for the purpose of facilitating the description and is not a limitation.

The control unit 416 detects whether the KEY-ON signal is high level or not at the timing when the control port P4 becomes low level, i.e., at the timing when the control port P1 becomes high level. That is, during the period of the standby state when all the LEDs 1 to 5 are turned off, since the LED 1 may become conductive when the control port P1 is high level, the control unit 416 utilizes the low-level period of the control port P1, which never makes the LED 1 conductive, to determine that the switch SW is turned on. Although the control unit 416 detects that the KEY-on signal changes to high level for a plurality of times to determine that the switch SW is turned on, this is not a limitation. For example, during the period of the standby state when all the LEDs 1 to 5 are turned off, it may be detected that the KEY-on signal starts changing to high level, changes to high level for a plurality of times, and then falls down to low level, and this may be used to determine that the switch SW is turned on. In this case, the control unit 416 can more reliably determine that the KEY-ON signal is changed to high level again as the switch SW is turned on.

The control unit 416 has a function of reading the battery remaining amount data stored in the battery remaining amount data storing unit 413 to control the signal output from the control signal generating unit 406 such that the control signal generating unit 406 outputs the first control signals PZ1 to PZ3 and the second control signals NZ1 to NZ4 for turning on any LEDs 1 to 5 in response to the battery remaining amount data, which is triggered by the supply of the KEY-ON signal determining that the switch SW is turned on. Specifically, a minimum voltage value is set to a value when the voltage of the battery 412 is in an empty state, and a maximum voltage value is set to a value when the voltage of the battery 412 is in a fully charged state. The range between the minimum voltage value and the maximum voltage value of the battery 412 is divided into five ranges, and the battery remaining amount data at the time of $1/5$, $2/5$, $3/5$, and $4/5$ of the fully charged state of the voltage of the battery 412 are written as reference values (hereinafter, battery remaining amount reference data) into the register, etc. within the control unit 416 with the use of hardware (or, the battery remaining amount reference data may be stored in the ROM 214 as table data). The control unit 416 compares the battery remaining amount reference data with the actual battery remaining amount data stored in the battery remaining amount data storing unit 413 and outputs the instruction signal to the control signal generating unit 406 so as to output the first control signals PZ1 to PZ3 and the second control signals NZ1 to NZ4, which become high level or low level appropriately in response to the comparison result. It is assumed that the LEDs 1 to 5 are disposed on a portion of a battery pack (not shown) housing the battery 412 in the order of the LEDs 1, 2, 3, 4, and 5. For example, if the battery remaining amount data indicate less than $1/5$ of the fully charged state of the battery 412, the control unit 416 supplies the control signal generating unit 406 with the instruction signal for turning on only the LED 1 (specifically, turning on and off the LED 1 repeatedly at about 100 Hz in synchronization with the clock signal D). If the battery remaining amount data indicate $1/5$ or greater and less than ⅖ of the fully charged state of the battery 412, the control unit 416 supplies the control signal generating unit 406 with the instruction signal for turning on the LEDs 1 and 2 (specifically, turning on and off the LEDs 1 and 2 repeatedly in a complementary manner at about 100 Hz in synchronization with the clock signal D). If the battery remaining amount data indicate ⅖ or greater and less than ⅗ of the fully charged state of the battery 412, the control unit 416 supplies the control signal generating unit 406 with the instruction signal for turning on the LEDs 1 to 3 (specifically, turning on and off the LEDs 1 to 3 repeatedly at about 100 Hz in synchronization with the clock signal D). If the battery remaining amount data indicate ⅗ or greater and less than ⅘ of the fully charged state of the battery 412, the control unit 416 supplies the control signal generating unit 406 with the instruction signal for turning on the LEDs 1 to 4 (specifically, turning on and off the LEDs 1 to 4 repeatedly at about 100 Hz in synchronization with the clock signal D). If the battery remaining amount data indicate greater than ⅘ of the fully charged state of the battery 412, the control unit 416 supplies the control signal generating unit 406 with the instruction signal for turning on all the LEDs 1 to 5 (specifically, turning on and off the LEDs 1 to 5 repeatedly at about 100 Hz in synchronization with the clock signal D).

<<Operation of Light Emitting Device Driving Apparatus>>

Figure 8:
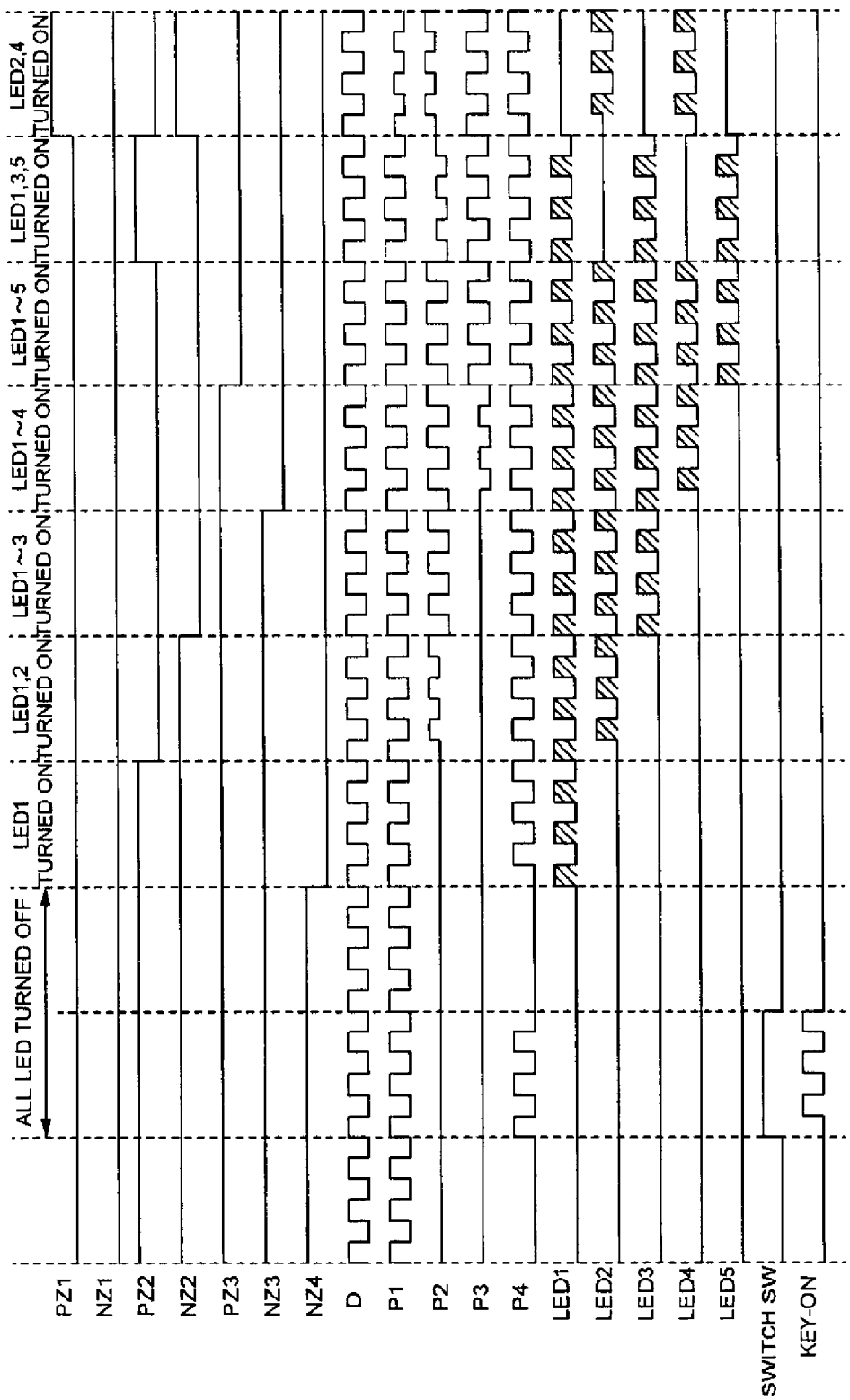
FIG. 8 is a time chart of the overall operation of the second implementation.

With reference to FIGS. 5 and 8, description will be made of the operation of the light emitting device driving apparatus according to another implementation.

When the battery pack (not shown) housing the battery 412 is mounted to the main body of and electrically connected to an electronic device (e.g., notebook personal computer), a voltage charged in the battery 412 is supplied to the integrated circuit 401. Specifically, the charged voltage is supplied to the integrated circuit 401 as the power supply voltage VDD for operating each component within the integrated circuit 401 and, particularly, the voltage charged in the battery 412 is supplied as analog information to the battery remaining amount detecting unit 411.

The integrated circuit 401 is reset until the power supply voltage VDD is raised to a value for normally operating each component within the integrated circuit 401. The reset of the integrated circuit 401 is subsequently released and the control operation can be executed for turning on/off the LEDs 1 to 5 by supplying each component with the power supply voltage VDD raised to the steady state. The control operation for turning on/off the LEDs 1 to 5 is achieved by decoding the program data read from the ROM 415 with the control unit 416 and by supplying appropriate components with the control signals and instruction signals output from the control unit 215 as a result of the decoding. An oscillator (not shown) provided separately from the oscillator 407 starts operating in accordance with the input of the power supply voltage VDD, and the control unit 416 is operated by supplying the operating clock from the oscillator.

First, the control unit 416 outputs the instruction signal for starting the oscillation of the oscillator 407. In this way, the oscillator 407 starts oscillating at the own oscillating frequency. The oscillating clock output from the oscillator 408 is divided by the divider 408 in a predetermined manner. On the other hand, the control unit 416 outputs the instruction signal for switching the switching circuit 409 to S1. In this way, the switching circuit 409 is switched to S1. Therefore, the divided output of about 100 Hz acquired from the divider 408 is supplied as the clock signal D to the logic circuits 402 and 404 via the switching circuit 409. On the other hand, the clock signal D is inverted by the inverter 410 to be the clock signal *D and the clock signal *D is supplied to the logic circuits 403 and 405. If the switch SW is not closed and no LEDs 1 to 5 have to be turned on, the control unit 416 supplies the control signal control unit 406 with the instruction signal for turning off all the LEDs 1 to 5. The control signal generating unit 406 outputs the low-level first control signal PZ1 and the high-level first control signals PZ2 and PZ3 and also outputs the low-level second control signal NZ1 and the high-level second control signals NZ2 to NZ4. Therefore, during the standby period for determining whether the switch SW is turned on or not (all LED turned-off period), if the switch SW is turned off, the control port P1 repeats the high level state and the low level state at a frequency of 100 Hz, for example; the control ports P2 and P3 is in the high impedance state; the control port P4 is low level; and therefore, all the LEDs 1 to 5 are in the OFF state.

The control unit 416 supplies the battery remaining amount detecting unit 411 with the instruction signal for checking the remaining amount of the battery 412. In this way, the battery remaining amount detecting unit 411 detects the remaining amount of the battery 412 and the detection result is output as the binarized battery remaining amount data. The battery remaining amount data are data updated at the certain sampling frequency, and the battery remaining amount data storing unit 413 overwrites the battery remaining amount data to store the updated data.

During the standby state, if the switch SW has been turned on for a certain period from the OFF state (and becomes the OFF state again), the control unit 416 is supplied with the KEY-ON signal changed to high level and low level only when the switch SW is turned on, which acts as an interruption request signal. If it is detected that the KEY-ON signal becomes high level for a plurality of times, the control unit 416 determines that the switch SW is turned on and the control unit 416 reads from the ROM 415 and decodes the program data for turning on any LEDs 1 to 5 indicating the remaining amount of the battery 412. The control unit 416 performs the control operation in accordance with the decode result of the program data. The control unit 416 reads the battery remaining amount data currently stored in the battery remaining amount data storing unit 413 to compare with the battery remaining amount reference data preliminarily prepared for indicating that the remaining amount of the battery 412 is ⅕, ⅖, ⅗, or ⅘ of the fully charged state. In response to the result of the comparison between the battery remaining amount data read from the battery remaining amount data storing unit 413 and the battery remaining amount reference data preliminarily prepared, the control unit 416 outputs the instruction signal such that the control signal generating unit 406 can output the first control signals PZ1 to PZ3 and the second control signals NZ1 to NZ4 at the logic levels that can turn on/off any LEDs 1 to 5 appropriately. If the control unit 416 detects the supply of the KEY-ON signal that enables the determination of the turning on of the switch SW, the timer 414 is reset by this detection output, clocks a predetermined time period (e.g., three seconds), and supplies the control unit 416 with a clocking end signal when the clocking of the predetermined time period is completed. That is, the control unit 416 supplies the control signal generating unit 406 with the instruction signal after determining that the switch SW is turned on and until the clocking end signal is supplied from the timer 414.

For example, when the control unit 416 compares the battery remaining amount data with the battery remaining amount reference data, if it is determined as a result that the remaining amount of the battery 412 is less than ⅕ of the fully charged state, the control unit 416 supplies the control signal generating unit 406 for a certain time period (the three seconds) with the instruction signal for turning on/off only the LED 1 at the frequency of the clock signal D. In accordance with the instruction signal, the control signal generating unit 406 supplies the logic circuit 402 with the low-level first control signal PZ1 and the low-level second control signal NZ1. The control signal generating unit 406 supplies the logic circuit 403 with the high-level first control signal PZ2 and the high-level second control signal NZ2. The control signal generating unit 406 supplies the logic circuit 404 with the high-level first control signal PZ3 and the high-level second control signal NZ3. The control signal generating unit 406 supplies the logic circuit 405 with the low-level second control signal NZ4. The clock signal D emerges directly at the control port P1. The control ports P2 and P3 become the high impedance states. The clock signal *D emerges directly at the control port P4. Therefore, only the LED 1 is dynamically driven and turned on at each period when the control port P1 becomes high level and the control port P4 is low level (diagonal lines show the time when the LED is turned on). In other words, only the LED 1 is turned on/off repeatedly at a frequency of about 100 Hz that changes the control port P1 to high level and low level. When the LED 1 is turned on/off at about 100 Hz, the LED 1 looks like turned on continuously to the human naked eye. Therefore, it can be checked that the remaining amount of the battery 412 is less than $\frac{1}{5}$ of the fully charged state for a certain time period (the three seconds) after detecting that the switch SW is turned on and until the timer 414 outputs the clocking end signal.

When the control unit 416 compares the battery remaining amount data with the battery remaining amount reference data, if it is determined as a result that the remaining amount of the battery 412 is $\frac{1}{5}$ or greater and less than $\frac{2}{5}$ of the fully charged state, the control unit 416 supplies the control signal generating unit 406 for a certain time period (the three seconds) with the instruction signal for turning on/off the LEDs 1 and 2 at the frequency of the clock signal D. In accordance with the instruction signal, the control signal generating unit 406 supplies the logic circuit 402 with the low-level first control signal PZ1 and the low-level second control signal NZ1. The control signal generating unit 406 supplies the logic circuit 403 with the low-level first control signal PZ2 and the high-level second control signal NZ2. The control signal generating unit 406 supplies the logic circuit 404 with the high-level first control signal PZ3 and the high-level second control signal NZ3. The control signal generating unit 406 supplies the logic circuit 405 with the low-level second control signal NZ4. The control port P1 becomes high level when the clock signal D is high level and becomes low level when the clock signal D is low level. The control port P2 becomes the high impedance state when the clock signal D is high level and becomes high level when the clock signal D is low level. The control port P3 becomes the high impedance state. The control port P4 becomes low level when the clock signal D is high level and becomes high level when the clock signal D is low level. Since the control ports P2 and P3 are the high impedance states and the control port P4 is low level when the control port P1 is high level, only the LED 1 is conductive and is turned on. On the other hand, since the control port P2 is high level; the control port P3 is the high impedance state; and the control port P4 is high level when the control port P1 is low level, only the LED 2 is conductive and is turned on. In other words, the LEDs 1 and 2 are turned on/off repeatedly in a complementary manner at a frequency of about 100 Hz that changes the levels of the control ports P1 and P2. When the LEDs 1 and 2 are turned on/off at about 100 Hz in a complementary manner, the LEDs 1 and 2 look like turned on continuously to the human naked eye. Therefore, it can be checked that the remaining amount of the battery 412 is $\frac{1}{5}$ or greater and less than $\frac{2}{5}$ of the fully charged state for a certain time period (the three seconds) after detecting that the switch SW is turned on and until the timer 414 outputs the clocking end signal.

When the control unit 416 compares the battery remaining amount data with the battery remaining amount reference data, if it is determined as a result that the remaining amount of the battery 412 is $\frac{2}{5}$ or greater and less than $\frac{3}{5}$ of the fully charged state, the control unit 416 supplies the control signal generating unit 205 for a certain time period (the three seconds) with the instruction signal for turning on/off the LEDs 1 to 3 at the frequency of the clock signal D. In accordance with the instruction signal, the control signal generating unit 406 supplies the logic circuit 402 with the low-level first control signal PZ1 and the low-level second control signal NZ1. The control signal generating unit 406 supplies the logic circuit 403 with the low-level first control signal PZ2 and the low-level second control signal NZ2. The control signal generating unit 406 supplies the logic circuit 404 with the high-level first control signal PZ3 and the high-level second control signal NZ3. The control signal generating unit 406 supplies the logic circuit 405 with the low-level second control signal NZ4. The control port P1 becomes high level when the clock signal D is high level and becomes low level when the clock signal D is low level. The control port P2 becomes low level when the clock signal D is high level and becomes high level when the clock signal D is low level. The control port P3 becomes the high impedance state. The control port P4 becomes low level when the clock signal D is high level and becomes high level when the clock signal D is low level as is the case with the control port P2. Since the control ports P2 and P4 are low level and the control port P3 is the high impedance state when the control port P1 is high level, the LEDs 1 to 3 are conductive and are turned on. On the other hand, since the control ports P2 and P4 are high level and the control port P3 is the high impedance state when the control port P1 is low level, only the LED 2 is conductive and is turned on. In other words, the LEDs 1 and 3 are turned on/off repeatedly in a complementary manner at a frequency of about 100 Hz that changes the levels of the control ports P1, P2, P4, and the LED 2 is turned on/off repeatedly in a complementary manner relative to the LEDs 1 and 3. When the LEDs 1 to 3 are turned on/off at about 100 Hz in a complementary manner, the LEDs 1 to 3 look like turned on continuously to the human naked eye. Therefore, it can be checked that the remaining amount of the battery 411 is $\frac{2}{5}$ or greater and less than $\frac{3}{5}$ of the fully charged state for a certain time period (the three seconds) after detecting that the switch SW is turned on and until the timer 414 outputs the clocking end signal.

When the control unit 416 compares the battery remaining amount data with the battery remaining amount reference data, if it is determined as a result that the remaining amount of the battery 412 is $\frac{3}{5}$ or greater and less than $\frac{4}{5}$ of the fully charged state, the control unit 416 supplies the control signal generating unit 406 for a certain time period (the three seconds) with the instruction signal for turning on/off the LEDs 1 to 4 at the frequency of the clock signal D. In accordance with the instruction signal, the control signal generating unit 406 supplies the logic circuit 402 with the low-level first control signal PZ1 and the low-level second control signal NZ1. The control signal generating unit 406 supplies the logic circuit 403 with the low-level first control signal PZ2 and the low-level second control signal NZ2. The control signal generating unit 406 supplies the logic circuit 404 with the high-level first control signal PZ3 and the low-level second control signal NZ3. The control signal generating unit 406 supplies the logic circuit 405 with the low-level second control signal NZ4. The control port P1 becomes high level when the clock signal D is high level and becomes low level when the clock signal D is low level. The control port P2 becomes low level when the clock signal D is high level and becomes high level when the clock signal D is low level. The control port P3 becomes the high impedance state when the clock signal D is high level and becomes low level when the clock signal D is low level. The control port P4 becomes low level when the clock signal D is high level and becomes high level when the clock signal D is low level. Since the control ports P2 and P4 are low level and the control port P3 is the high impedance state when the control port P1 is high level, the LEDs 1 to 3 are conductive and are turned on. On the other hand, since the control ports P2 and P4 are high level and the control port P3 is low level when the control port P1 is low level, the LEDs 2 and 4 are conductive and are turned on. In other words, the LEDs 1 and 3 are turned on/off repeatedly in a complementary manner at a frequency of about 100 Hz that changes the levels of the control ports P1 and P2, and the LEDs 2 and 4 are turned on/off repeatedly in a complementary manner relative to the LEDs 1 and 3. When the LEDs 1 and 3 and the LEDs 2 and 4 are turned on/off at about 100 Hz in a complementary manner, the LEDs 1 to 4 look like turned on continuously to the human naked eye. Therefore, it can be checked that the remaining amount of the battery 412 is ⅗ or greater and less than ⅘ of the fully charged state for a certain time period (the three seconds) after detecting that the switch SW is turned on and until the timer 414 outputs the clocking end signal.

When the control unit 416 compares the battery remaining amount data with the battery remaining amount reference data, if it is determined as a result that the remaining amount of the battery 412 is equal to or greater than ⅘ of the fully charged state, the control unit 416 supplies the control signal generating unit 406 for a certain time period (the three seconds) with the instruction signal for turning on/off all the LEDs 1 to 5 at the frequency of the clock signal D. In accordance with the instruction signal, the control signal generating unit 406 supplies the logic circuit 402 with the low-level first control signal PZ1 and the low-level second control signal NZ1. The control signal generating unit 406 supplies the logic circuit 403 with the low-level first control signal PZ2 and the low-level second control signal NZ2. The control signal generating unit 406 supplies the logic circuit 404 with the low-level first control signal PZ3 and the low-level second control signal NZ3. The control signal generating unit 406 supplies the logic circuit 405 with the low-level second control signal NZ4. The control ports P1 and P3 become high level when the clock signal D is high level and become low level when the clock signal D is low level. The control ports P2 and P4 become low level when the clock signal D is high level and become high level when the clock signal D is low level. Since the control ports P2 and P4 are low level and the control port P3 is high level when the control port P1 is high level, the LEDs 1, 3, are conductive and are turned on. On the other hand, since the control ports P2 and P4 are high level and the control port P3 is low level when the control port P1 is low level, the LEDs 2 and 4 are conductive and are turned on. In other words, the LEDs 1, 3, 5 are turned on/off repeatedly in a complementary manner at a frequency of about 100 Hz that changes the levels of the control ports P1 and P2, and the LEDs 2 and 4 are turned on/off repeatedly in a complementary manner relative to the LEDs 1, 3, 5. When the LEDs 1, 3, 5 and the LEDs 2 and 4 are turned on/off at about 100 Hz in a complementary manner, all the LEDs 1 to 5 look like turned on continuously to the human naked eye. Therefore, it can be checked that the remaining amount of the battery 211 greater than ⅘ of the fully charged state for a certain time period (the three seconds) after detecting that the switch SW is turned on and until the timer 414 outputs the clocking end signal.

It has been described that five types of status display can be achieved in the second implementation by appropriately setting the four control ports P1 to P4 to any states of high level, low level, and high impedance to perform the indicator display of the five LEDs 1 to 5. However, if the LEDs 1 to 5 can perform other types of status display in addition to the five types of status display, various states including the remaining amount of the battery 412 can be checked in detail. For example, it is desirable to be able to perform display other than the remaining amount display when indicating that it is the replacement timing for the battery 412 because the remaining amount of the battery 412 is little and when the abnormality of the battery 412 is found because the voltage supply from the battery 412 mounted to the electronic device is unstable.

If the indication is achieved when it is the replacement timing for the battery 412 because the remaining amount of the battery 412 is little, in the control unit 416, battery remaining reference data are further written into an internal register etc. for indicating that the remaining amount of the battery 412 is less than ⅕ of the fully charged state (e.g., data indicating that the remaining amount of the battery 412 is 1/10 of the fully charged state). When the control unit 416 is supplied with the KEY-ON signal that enables the determination of the turning on of the switch SW to compare the battery remaining amount data with the battery remaining amount reference data, if it is determined as a result that the remaining amount of the battery 412 is less than 1/10 of the fully charged state, the control unit 416 supplies the control signal generating unit 406 with the instruction signal for turning on/off the odd-numbered LEDs 1, 3, 5 at the frequency of the clock signal D. In accordance with the instruction signal, the control signal generating unit 406 supplies the logic circuit 402 with the low-level first control signal PZ1 and the low-level second control signal NZ1. The control signal generating unit 205 supplies the logic circuit 403 with the high-level first control signal PZ2 and the low-level second control signal NZ2. The control signal generating unit 406 supplies the logic circuit 404 with the low-level first control signal PZ3 and the low-level second control signal NZ3. The control signal generating unit 406 supplies the logic circuit 405 with the low-level second control signal NZ4. The control ports P1 and P3 become high level when the clock signal D is high level and become low level when the clock signal D is low level. The control port P2 becomes low level when the clock signal D is high level and becomes the high impedance state when the clock signal D is low level. The control port P4 becomes low level when the clock signal D is high level and becomes high level when the clock signal D is low level. Since the control ports P2 and P4 are low level and the control port P3 is high level when the control port P1 is high level, the LEDs 1, 3, 5 are conductive and are turned on. On the other hand, since the control port P2 is the high impedance state; the control port P3 is low level; and the control port P4 is high level when the control port P1 is low level, all the LEDs 1 to 5 are turned off. In other words, the LEDs 1, 3, 5 are turned on/off repeatedly in a complementary manner at a frequency of about 100 Hz that changes the levels of the control ports P1 to P4. When the LEDs 1, 3, 5 are turned on/off at about 100 Hz in a complementary manner, the LEDs 1, 3, 5 look like turned on continuously to the human naked eye. Therefore, it can be checked that the remaining amount of the battery 412 is less than 1/10 of the fully charged state and that it is the replacement timing for the battery 412 for a certain time period (the three seconds) after the interruption request signal DT is generated and until the timer 414 outputs the clocking end signal. The instruction signal for turning on the LEDs 1, 3, 5 supplied from control unit 416 to the control signal generating unit 406 is not limited to the KEY-ON signal. For example, after the control unit 416 determines once that the remaining amount of the battery 412 is less than 1/5 of the fully charged state, the control unit 416 may compare the battery remaining amount reference data indicating that the remaining amount of the battery 412 is 1/10 of the fully charged state with the battery remaining amount data updated and stored in the battery remaining amount data storing unit 413 at a certain sampling frequency and when it is determined that the actual remaining amount of the battery 412 is less than 1/10 of the fully charged state, the control unit 416 may turn on the LEDs 1, 3, 5 periodically to notify of the replacement timing for the battery 412. The program data for this purpose is written into the ROM 415 and the timer 414 is controlled by the control unit 416 to clock the time period for turning on the LEDs 1, 3, 5.

On the other hand, in the latter case, i.e., if the indication is achieved when the abnormality of the battery 412 is found because the voltage supply from the battery 412 mounted to the electronic device is unstable, program data are written into the ROM 415 in advance for the control unit 416 monitoring the degree of the change in the battery remaining amount data read from the battery remaining amount data storing unit 412, along with reference data used when the control unit 416 determines that the abnormality of the battery 412 is found. In this case, although the battery remaining amount data storing unit 413 stores the updated battery remaining amount data from the battery remaining amount detecting unit 411, rather than updating and storing the battery remaining amount data at the same address, a plurality of the battery remaining amount data detected for each certain sampling period is stored at a plurality of addresses (e.g., the battery remaining amount data are acquired for ten times at the sampling frequency of 60 seconds and are subsequently updated and stored repeatedly). When the LEDs 1 to 5 are turned on/off in accordance with the determination of the turning on of the switch SW, the utilized battery remaining amount data are the latest battery remaining amount data stored in the battery remaining amount data storing unit 413. The control unit 416 is triggered by the supply of the KEY-ON signal that enables the determination of the turning on of the switch SW to read the latest battery remaining amount data stored in the battery remaining amount data storing unit 413 to control the turning on/off of the LEDs 1 to 5. The control unit 416 then monitors the degrees of the changes in a plurality of the battery remaining amount data read from the battery remaining amount data storing unit 413 to determine whether the abnormality of the battery 412 exists or not. When the control unit 416 monitors the degrees of the changes in the battery remaining amount data, if it is determined as a result that the abnormality of the battery 412 is found, the control unit 416 makes the timer 414 clock for a certain time period (e.g., five seconds) and supplies the control signal generating unit 406 with the instruction signal for turning on/off the LEDs 2, 4 at the frequency of the clock signal D during the certain time period clocked by the timer 414. In accordance with the instruction signal, the control signal generating unit 406 supplies the logic circuit 402 with the high-level first control signal PZ1 and the low-level second control signal NZ1. The control signal generating unit 406 supplies the logic circuit 403 with the low-level first control signal PZ2 and the high-level second control signal NZ2. The control signal generating unit 406 supplies the logic circuit 404 with the low-level first control signal PZ3 and the low-level second control signal NZ3. The control signal generating unit 406 supplies the logic circuit 405 with the low-level second control signal NZ4. The control port P1 becomes the high impedance state when the clock signal D is high level and becomes low level when the clock signal D is low level. The control port P3 becomes high level when the clock signal D is high level and becomes low level when the clock signal D is low level. Since the control ports P1 and P2 are the high impedance states when the control port P3 is high level, all the LEDs 1 to 5 are turned off. On the other hand, since the control port P1 is low level and the control ports P2 and P4 are high level when the control port P3 is low level, the LEDs 2, 4 are conductive and are turned on. In other words, the LEDs 2, 4 are turned on/off repeatedly in a complementary manner at a frequency of about 100 Hz that changes the levels of the control ports P1 to P3. When the LEDs 2, 4 are turned on/off at about 100 Hz in a complementary manner, the LEDs 2, 4 look like turned on continuously to the human naked eye. Therefore, it can be checked that the abnormality exists in the battery 412.

The case of turning on the LEDs 1, 3, 5 or the LEDs 2, 4 is not limited to the above description. However, since the indicator display of the remaining amount of the battery 412 is performed with the use of the LEDs 1 to 5 when the electronic device is operated normally, the display performed by turning on the LEDs 1, 3, 5 or the LEDs 2, 4 is effective when notifying a user of the status of the electronic device urgently, etc.

As described above, according to the second implementation, seven types of display status can be generated by connecting the five LEDs 1 to 5 and the switch SW to the four control ports P1 to P4 to appropriately perform the dynamic drive, which is triggered by the generation of the KEY-ON signal that becomes high level and low level repeatedly when the switch SW is closed. The indicator display can be performed effectively when the remaining amount of the battery 211 is less than 1/5, 1/5 or greater and less than 2/5, 2/5 or greater and less than 3/5, 3/5 or greater and less than 4/5, and greater than 4/5 by arranging the LEDs 1 to 5 in the order of the LED 1, the LED 2, the LED 3, the LED 5, and the LED 4.

<<Variation of Second Implementation>>

Figure 9:
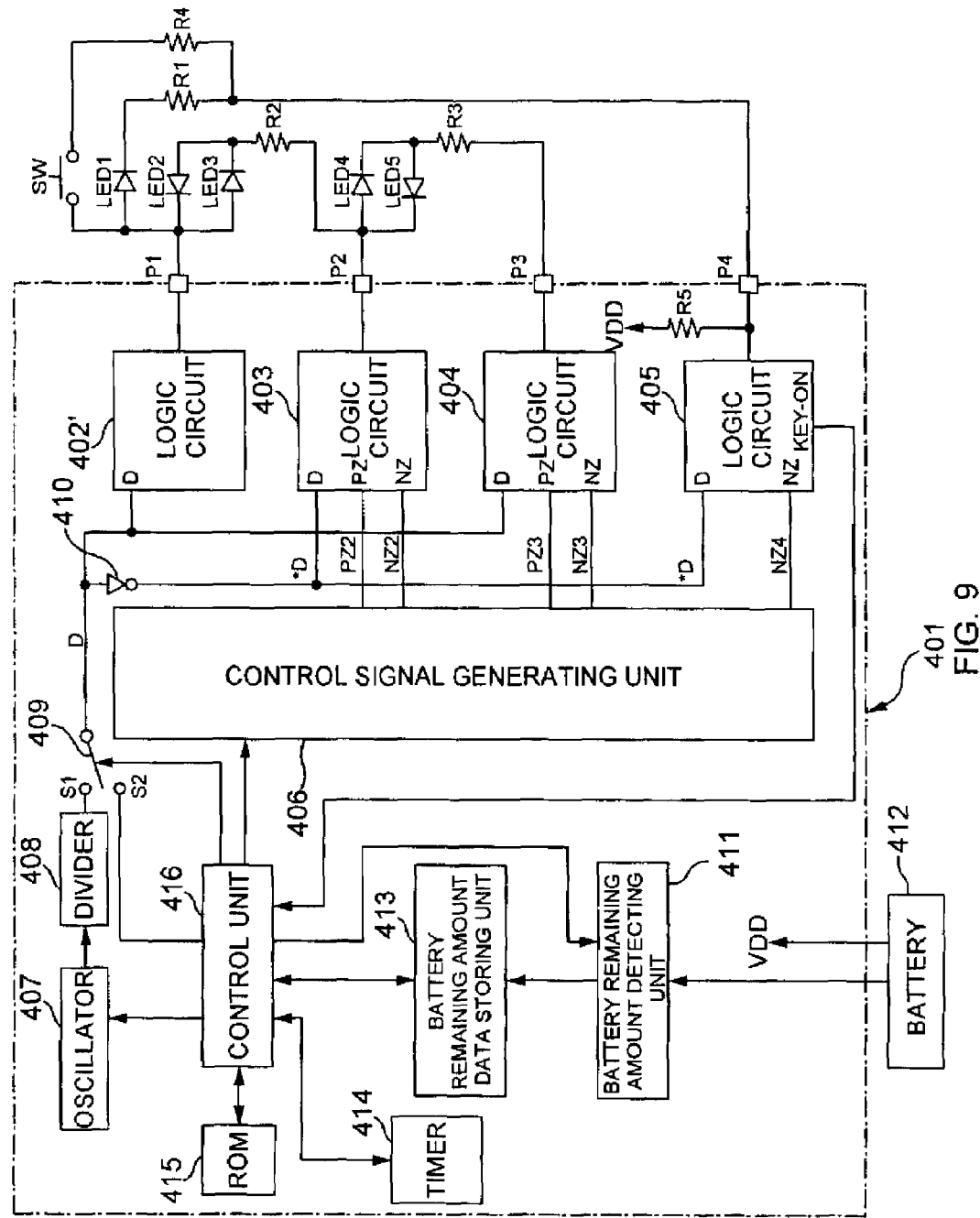
FIG. 9 is a circuit block diagram of the modification of the second implementation.
Figure 10:
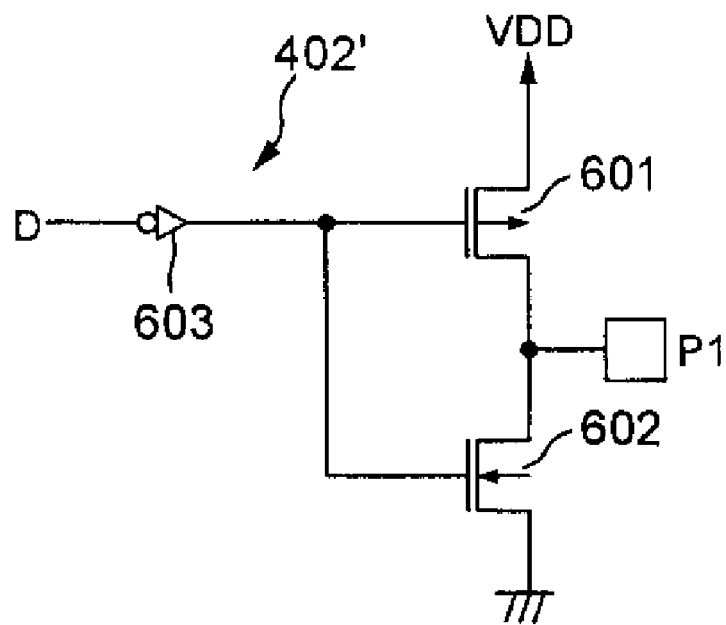
FIG. 10 is a circuit diagram of a configuration example of a logic circuit used in the modification of the second implementation.
Figure 11:
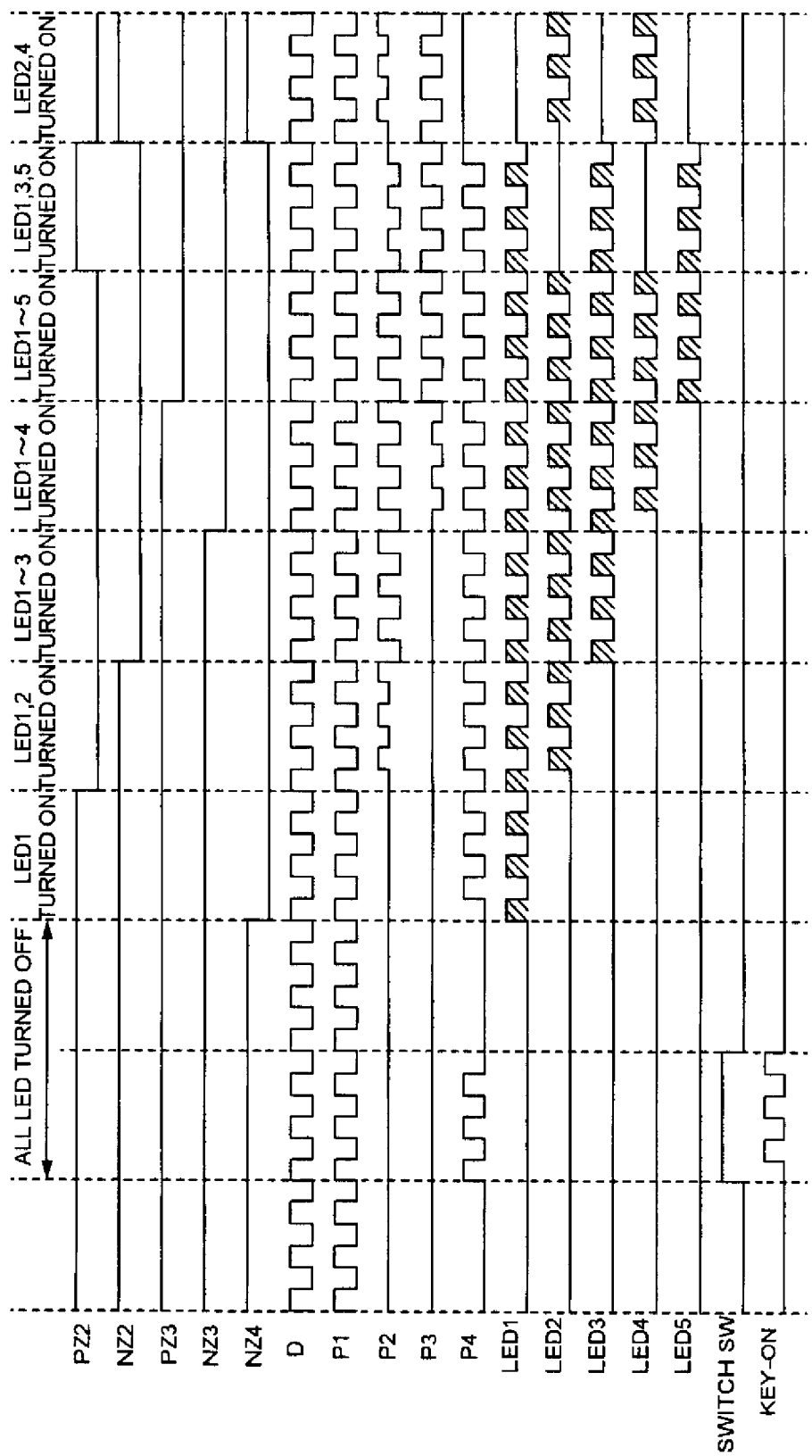
FIG. 11 is a time chart of the overall operation of the modification of the second implementation.

With reference to FIGS. 9, 10, and 11, description will be made of a variation of the light emitting device drive controller and the light emitting device driving apparatus of the present invention. FIG. 9 is a circuit block diagram of another implementation of the light emitting device driving apparatus of the present invention. FIG. 10 is a circuit diagram of an example of a logic circuit replacing the logic circuit 402 of FIG. 5. FIG. 11 is a time chart of the operation of FIG. 9.

In FIG. 9, a configuration surrounded by a dot-and-dash line on the page shows the light emitting device drive controller, which is constituted by an integrated circuit, for example, a microcomputer with a controlling function of turning on/off light emitting devices and which is disposed on a first printed board (not shown) for driving the light emitting devices. On the other hand, a rightward configuration not surrounded by the dot-and-dash line on the page is external components of the integrated circuit, which is disposed on a second printed board for display (not shown: e.g., a board within a display). In the implementation of the following description, as is the case with the first implementation, the light emitting device drive controller and the light emitting device driving apparatus of the present invention are used for the purpose of performing indicator display of a remaining amount level of a battery mounted to an electronic device for supplying a power supply voltage to the electronic device, for example.

In FIG. 9, a difference with FIG. 5 is that the logic circuit 402 of FIG. 5 is replaced with a logic circuit 402' shown in FIG. 10 to eliminate the use of the first control signal PZ1 and the second control signal NZ1. Since the rest of the configuration of FIG. 9 is the same as that of FIG. 5, the same portions will not be described.

The logic circuit 402' is supplied with the clock signal D and outputs low level or high level in response to the level of the clock signal D. Specifically, as shown in FIG. 10, the logic circuit 402' is composed of a P-MOSFET 601 and an N-MOSFET 602 connected serially between the power supply voltage VDD and ground, and an inverter 603. The clock signal is supplied to the gates of the N-MOSFET 602 and the P-MOSFET 601 via the inverter 603. The drains of the P-MOSFET 601 and the N-MOSFET 602 are connected to the control port P1. Therefore, when the clock signal D is high level, the P-MOSFET 601 is turned on and the control port P1 becomes high level. On the other hand, when the clock signal D is low level, the N-MOSFET 602 is turned on and the control port P1 becomes low level. That is, the clock signal D is output directly from the control port P1. Since the control signal generating unit 406 does not have to output a signal for controlling the logic circuit 402', the configuration of the control signal generating unit 406 can be simplified and the burden of the software can be alleviated in the control unit 416.

Because the logic circuit 402' is employed, the operations of FIG. 5 and FIG. 9 are different in that the control signal output from the control signal generating unit 406 is different when the even-numbered LEDs 2 and 4 are turned on. The operation in this case will be described in accordance with the case of FIG. 5.

For example, if the indication is achieved when the abnormality of the battery 412 is found because the voltage supply from the battery 412 mounted to the electronic device is unstable, program data are written into the ROM 415 in advance for the control unit 416 monitoring the degree of the change in the battery remaining amount data read from the battery remaining amount data storing unit 412, along with reference data used when the control unit 416 determines that the abnormality of the battery 412 is found. In this case, although the battery remaining amount data storing unit 413 stores the updated battery remaining amount data from the battery remaining amount detecting unit 411, rather than updating and storing the battery remaining amount data at the same address, a plurality of the battery remaining amount data detected for each certain sampling period is stored at a plurality of addresses (e.g., the battery remaining amount data are acquired for ten times at the sampling frequency of 60 seconds and are subsequently updated and stored repeatedly). When the LEDs 1 to 5 are turned on/off in accordance with the determination of the turning on of the switch SW, the utilized battery remaining amount data are the latest battery remaining amount data stored in the battery remaining amount data storing unit 413. The control unit 416 is triggered by the supply of the KEY-ON signal that enables the determination of the turning on of the switch SW to read the latest battery remaining amount data stored in the battery remaining amount data storing unit 413 to control the turning on/off of the LEDs 1 to 5. The control unit 416 then monitors the degrees of the changes in a plurality of the battery remaining amount data read from the battery remaining amount data storing unit 413 to determine whether the abnormality of the battery 412 exists or not. When the control unit 416 monitors the degrees of the changes in the battery remaining amount data, if it is determined as a result that the abnormality of the battery 412 is found, the control unit 416 makes the timer 414 clock for a certain time period (e.g., five seconds) and supplies the control signal generating unit 406 with the instruction signal for turning on/off the LEDs 2, 4 at the frequency of the clock signal D during the certain time period clocked by the timer 414. In accordance with the instruction signal, the control signal generating unit 406 supplies the logic circuit 403 with the low-level first control signal PZ2 and the high-level second control signal NZ2. The control signal generating unit 406 supplies the logic circuit 404 with the low-level first control signal PZ3 and the low-level second control signal NZ3. The control signal generating unit 406 supplies the logic circuit 405 with the high-level second control signal NZ4. The control port P1 becomes the state of outputting the clock signal D directly. The control port P2 becomes the high impedance state when the clock signal D is high level and becomes high level when the clock signal D is low level. The control port P3 changes as is the case with the control port P1. That is, the control port P3 becomes high level when the clock signal D is high level and becomes low level when the clock signal D is low level. The control port P4 is fixed to high level. When the control port P1 is high level, since the control port P4 is high level, the LED 1 is turned off, and since the control port P2 is the high impedance state, the LEDs 2 to 5 are also turned off. On the other hand, when the control port P1 is low level, since the control port P4 is high level, the LED 1 is turned off, and since the control port P2 is high level and the control port P3 is low level, the LEDs 2 and 4 are turned on. In other words, the LEDs 2 and 4 are turned on/off repeatedly in a complementary manner at a frequency of about 100 Hz that changes the levels of the control ports P1 to P3. When the LEDs 2, 4 are turned on/off at about 100 Hz in a complementary manner, the LEDs 2, 4 look like turned on continuously to the human naked eye. Therefore, it can be checked that the abnormality exists in the battery 412.

As described above, according to the second implementation, seven types of display status can be generated by connecting the five LEDs 1 to 5 and the switch SW to the four control ports P1 to P4 to appropriately perform the dynamic drive, which is triggered by the generation of the KEY-ON signal that becomes high level and low level repeatedly when the switch SW is closed. The indicator display can be performed effectively when the remaining amount of the battery 211 is less than 1/5, 1/5 or greater and less than 2/5, 2/5 or greater and less than 3/5, 3/5 or greater and less than 4/5, and greater than 4/5 by arranging the LEDs 1 to 5 in the order of the LED 1, the LED 2, the LED 3, the LED 5, and the LED 4.

CONCLUSION

As described above, the light emitting device drive controller of the first implementation includes: the control port P1 that is connected to one end of the first light emitting device group (LED 2, LED 3) where the light emitting devices are connected in parallel in the opposite directions; the control port P2 that is connected to the other end of the first light emitting device group (LED 2, LED 3) as well as connected to one end of the second light emitting device group (LED 4, LED 5) where the light emitting devices are connected in parallel in the opposite directions; the control port P3 that is connected to the other end of the second light emitting device group (LED 4, LED 5); and a port state setting unit (the logic circuits 202 to 204, the control signal generating unit 205, the control unit 215) that selectively sets each of the control ports P1 to P3 to any one of the state of high level, the state of low level, and the high impedance state for each consecutive predetermined period (a ½ period of the clock signal D), and the light emitting device drive controller drives the LEDs 2 to 5 selectively in response to the states of the control ports P1 to P3. According to the light emitting device drive controller, the four LEDs 2 to 5 can be connected to the three control ports P1 to P3 to perform the lighting display of different statuses with the use of the LEDs 2 to 5. Therefore, as compared to the conventional static drive type light emitting device driving apparatus shown in FIG. 6 and the conventional dynamic drive type light emitting device driving apparatus shown in FIG. 7, the number of the ports for connecting the four LEDs 2 to 5 can be reduced. That is, the miniaturization of the integrated circuit 201 can be achieved; the number of wirings can also be reduced between the integrated circuit 201 mounted on the first printed board for driving the LEDs and the LEDs 2 to 5 mounted on the second printed board for the display; and consequently, the costs of the apparatus itself can be reduced.

Figure 12:
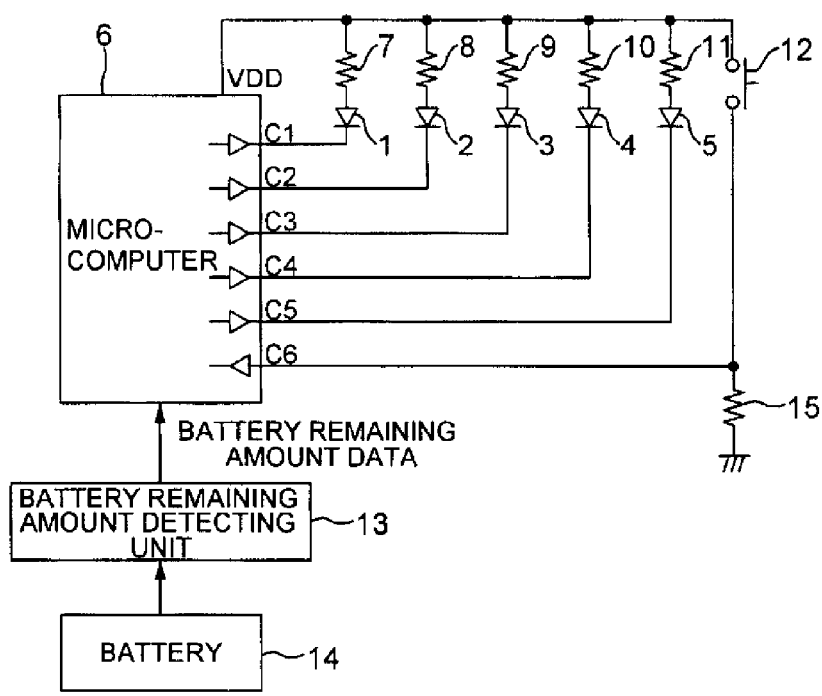
FIG. 12 is a circuit block diagram of a conventional static drive type light emitting device driving apparatus.
Figure 13:
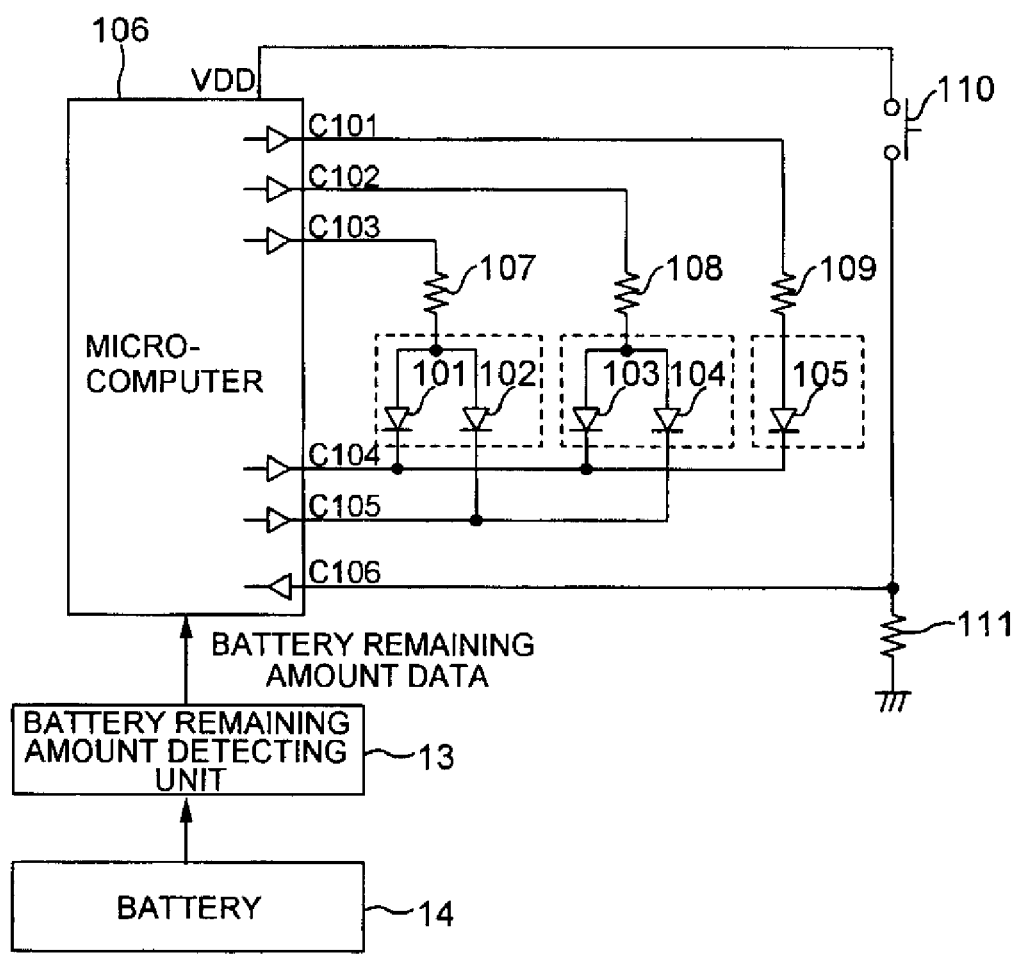
FIG. 13 is a circuit block diagram of a conventional dynamic drive type light emitting device driving apparatus.

The control port P1 is a port that is further connected to the single LED 1 located between the control port P1 and the ground voltage, and the LEDs 1 to 5 can be driven selectively in response to the states of the control ports P1 to P3. In this regard, by adding the LED 1, the five LEDs 1 to 5 can be connected to the three control ports P1 to P3 to further perform the lighting display of different statuses with the use of the LEDs 1 to 5. Therefore, as compared to the conventional static drive type light emitting device driving apparatus shown in FIG. 12 and the conventional dynamic drive type light emitting device driving apparatus shown in FIG. 13, the number of the ports for connecting the five LEDs 1 to 5 is further reduced, and the above effect becomes prominent.

The logic circuits 202 to 204 are also included which are provided respectively for the control ports P1 to P3 to set each of the control ports P1 to P3 to any one of the state of high level, the state of low level, and the high impedance state for each predetermined period (a ½ period of the clock signal D). In this regard, since the states of the control ports P1 to P3 are set by the output of the logic circuits 202 to 204 that are hardware, the turning on/off of the LEDs 1 to 5 can be controlled reliably.

Each of the logic circuits 202 to 204 includes the P-MOSFET 301 and the N-MOSFET 302 connected serially that have drains forming a serial connection point connected to each of the control ports P1 to P3, and the logical circuit (inside of the dotted line of FIG. 2) that operates the P-MOSFET 301 and the N-MOSFET 302 based on the first control signals PZ1 to PZ3 turning off the P-MOSFET 301 in the case of one logic level (high level), the second control signals NZ1 to NZ3 turning off the N-MOSFET 302 in the case of one logic level (high level), and the clock signal D (*D) changed for each predetermined period; when the first control signals PZ1 to PZ3 and the second control signals NZ1 to NZ3 are one logic level, the logic circuit makes the serial connection point of the both FET 301, 302 become the high impedance state regardless of the clock signal D (*D); when the first control signals PZ1 to PZ3 and the second control signals NZ1 to NZ3 are the other logic level (low level), the logic circuit makes the serial connection point become the state of high level or low level in synchronization with the clock signal D (*D); when the first control signals PZ1 to PZ3 are one logic level and the second control signals NZ1 to NZ3 are the other logic level, the logic circuit makes the serial connection point become the high impedance state or the state of low level in synchronization with the clock signal D (*D); and when the first control signals PZ1 to PZ3 are the other logic level and the second control signals NZ1 to NZ3 are one logic level, the logic circuit makes the serial connection point become the high impedance state or the state of high level in synchronization with the clock signal D (*D).

The control signal generating unit 205 is also included for generating the first control signals PZ1 to PZ3 and the second control signals NZ1 to NZ3, which become one or the other logic level in response to changes in a predetermined factor (the remaining amount of the battery 211).

The clock signal D is a signal acquired by dividing the oscillating clock of a predetermined frequency generated from an oscillation circuit (the oscillator 206) with the divider 207 in a predetermined manner. In this regard, the logic circuits 202 to 204 can be reliably operated by the clock signal D (*D) generated with hardware. Since the control unit 215 does not have to include a function for generating the clock signal D, the burden of the program process of the ROM 214 can be alleviated to achieve the stable control operation of the control unit 215.

The light emitting device drive controller of the second implementation includes: the control port P1 that is connected to one end of the first light emitting device group (LED 2, LED 3) where the light emitting devices are connected in parallel in the opposite directions; the control port P2 that is connected to the other end of the first light emitting device group (LED 2, LED 3) as well as connected to one end of the second light emitting device group (LED 4, LED 5) where the light emitting devices are connected in parallel in the opposite directions; the control port P3 that is connected to the other end of the second light emitting device group (LED 4, LED 5); the control port P4 that is connected to the other end of the switch SW for checking the state of the change in the predetermined factor (remaining amount of the battery 412), which has one end connected to the controlling port P1; a detecting unit (the control unit 416) that detects that the switch SW is closed; and a port state setting unit (the logic circuits 402 to 405, the control signal generating unit 406, the control unit 416) that selectively sets all or some of the control ports P1 to P4 to any one of the state of high level, the state of low level, and the high impedance state for each consecutive predetermined period (a ½ period of the clock signal D) based on the detection result when the detecting unit (control unit 416) detects that the switch SW is closed and the state of the change in the predetermined factor, and the light emitting device drive controller drives the first light emitting device group (LED 2, LED 3) and the second light emitting device group (LED 4, LED 5) selectively in response to the states of the control ports P1 to P4. According to the light emitting device drive controller, the four LEDs 2 to 5 and the switch SW can be connected to the four control ports P1 to P4 to perform the lighting display of different statuses with the use of the LEDs 2 to 5, which is triggered by closing the switch SW. Therefore, as compared to the conventional static drive type light emitting device driving apparatus shown in FIG. 12 and the conventional dynamic drive type light emitting device driving apparatus shown in FIG. 13, the number of the ports for connecting the four LEDs 2 to 5 can be reduced to three (the control ports P1 to P3). Another control port P4 can be used to supply the integrated circuit 401 with the KEY-ON signal indicating that the remaining amount of the battery 412 is wanted to be checked. That is, the miniaturization of the integrated circuit 401 can be achieved; the number of wirings can also be reduced between the integrated circuit 401 mounted on the first printed board for driving the LEDs and the LEDs 2 to 5 mounted on the second printed board for the display; and consequently, the costs of the apparatus itself can be reduced. Since the LEDs 2 to 5 are controlled and turned on only when the interruption request signal DT is generated, the power consumption of the integrated circuit 401 is constrained and the longer operating life of the battery 412 can be achieved.

The control ports P1 to P4 are ports where the LED 1 is further connected between the control ports P1 and P4, and the LEDs 1 to 5 can be driven selectively in response to the state of the control ports P1 to P4. In this regard, by adding the LED 1, the five LEDs 1 to 5 and the switch SW can be connected to the four control ports P1 to P4 to further perform the lighting display of different statuses with the use of the LEDs 1 to 5. Therefore, as compared to the conventional static drive type light emitting device driving apparatus shown in FIG. 12 and the conventional dynamic drive type light emitting device driving apparatus shown in FIG. 13, the number of the ports for connecting the five LEDs 1 to 5 is further reduced, and the above effect becomes prominent.

The logic circuits 402 to 405 are also included which are provided respectively for the control ports P1 to P4 to set each of the control ports P1 to P3 to any one of the state of high level, the state of low level, and the high impedance state for each predetermined period. In this regard, since the states of the control ports P1 to P4 are set by the output of the logic circuits 402 to 405 that are hardware, the turning on/off of the LEDs 1 to 5 can be controlled reliably.

Each of the logic circuits 402 to 404 includes the P-MOSFET 301 and the N-MOSFET 302 connected serially that have drains forming a serial connection point connected to each of the control ports P1 to P4, and the logical circuit (inside of the dotted line of FIG. 2) that operates the P-MOSFET 301 and the N-MOSFET 302 based on the first control signals PZ1 to PZ4 turning off the P-MOSFET 301 in the case of one logic level (high level), the second control signals NZ1 to NZ4 turning off the N-MOSFET 302 in the case of one logic level (high level), and the clock signal D (*D) changed for each predetermined period; when the first control signals PZ1 to PZ4 and the second control signals NZ1 to NZ4 are one logic level, the logic circuit makes the serial connection point become the high impedance state regardless of the clock signal D (*D); when the first control signals PZ1 to PZ4 and the second control signals NZ1 to NZ4 are the other logic level (low level), the logic circuit makes the serial connection point become the state of high level or low level in synchronization with the clock signal D (*D); when the first control signals PZ1 to PZ4 are one logic level and the second control signals NZ1 to NZ4 are the other logic level, the logic circuit makes the serial connection point become the high impedance state or the state of low level in synchronization with the clock signal D (*D); and when the first control signals PZ1 to PZ4 are the other logic level and the second control signals NZ1 to NZ4 are one logic level, the logic circuit makes the serial connection point become the high impedance state or the state of high level in synchronization with the clock signal D (*D).

The control signal generating unit 406 is also included for generating the first control signals PZ1 to PZ3 and the second control signals NZ1 to NZ4, which become one logic level or the other logic level in response to changes in a predetermined factor.

The clock signal D (*D) is a signal acquired by dividing the oscillating clock of a predetermined frequency generated from an oscillation circuit (the oscillator 407) with the divider 408 in a predetermined manner. In this regard, the logic circuits 402 to 405 can be reliably operated by the clock signal D (*D) generated with hardware. Since the control unit 416 does not have to include a function for generating the clock signal D, the burden of the program process of the ROM 214 can be alleviated to achieve the stable control operation of the control unit 416.

The timer 414 is also included for clocking a certain time period (>the predetermined period) based on the detection result when the detecting unit (control unit 416) detects that the switch SW is closed, and the port state setting unit sets each of the controlling port P1 to P4 to any one of the state of high level, the state of low level, and the high impedance state for each of the predetermined periods until the timer clocks the certain time period. In this regard, any LEDs 1 to 5 indicating the state of the change of the predetermined factor can be turned on reliably after the interruption request signal DT is generated and until the timer 414 clocks the certain time period.

The light emitting device driving apparatus of the first implementation includes: the first light emitting device group (LED 2, LED 3) where the light emitting devices are connected in parallel in the opposite directions; the second light emitting device group (LED 4, LED 5) where the light emitting devices are connected in parallel in the opposite directions; the control port P1 that is connected to one end of the first light emitting device group (LED 2, LED 3); the control port P2 that is connected to the other end of the first light emitting device group (LED 2, LED 3) as well as connected to one end of the second light emitting device group (LED 4, LED 5); the control port P3 that is connected to the other end of the second light emitting device group (LED 4, LED 5); and the port state setting unit (the logic circuits 202 to 204, the control signal generating unit 205, the control unit 215) that selectively sets each of the control ports P1 to P3 to any one of the state of high level, the state of low level, and the high impedance state for each consecutive predetermined period (a ½ period of the clock signal D), and the light emitting device driving apparatus drives the LEDs 2 to 5 selectively in response to the states of the control ports P1 to P3.

The light emitting device driving apparatus of the second implementation includes: the first light emitting device group (LED 2, LED 3) where the light emitting devices are connected in parallel in the opposite directions; the second light emitting device group (LED 4, LED 5) where the light emitting devices are connected in parallel in the opposite directions; the switch SW for checking the state of the change in the predetermined factor (remaining amount of the battery 412); the control port P1 that is connected to one end of the first light emitting device group (LED 2, LED 3); the control port P2 that is connected to the other end of the first light emitting device group (LED 2, LED 3) as well as connected to one end of the second light emitting device group (LED 4, LED 5); the control port P3 that is connected to the other end of the second light emitting device group (LED 4, LED 5); the control port P4 that is connected to the other end of the switch SW, which has one end connected to the controlling port P1; the detecting unit (control unit 416) that detects that the switch SW is closed; the port state setting unit (the logic circuits 402 to 405, the control signal generating unit 406, the control unit 416) that selectively sets all or some of the control ports P1 to P4 to any one of the state of high level, the state of low level, and the high impedance state for each consecutive predetermined period based on the detection result when the detecting unit (control unit 416) detects that the switch SW is closed and the state of the change in the predetermined factor, and the light emitting device driving apparatus drives the LEDs 2 to 5 selectively in response to the states of the control ports P1 to P4.

While description has been made of the light emitting device drive controller and the light emitting device driving apparatus according to the present invention, the above description is for the purpose of facilitating the understanding of the present invention and is not intended to limit the scope of the present invention. Although the implementations are described for displaying a remaining amount of a battery of an electronic device, the present invention may be used for a remaining amount of a battery of an electric-powered bicycle. The present invention may be modified or altered without departing from the spirit thereof and the present invention includes equivalents thereof, of course. For example, although description has been made of an example of turning on any LEDs 1 to 5 for a certain time period after it is determined that the switch SW is turned on in the implementations, this is not a limitation. If the switch is turned on continuously for a longer period (e.g., more than five seconds), the lighting operation of any LEDs 1 to 5 may be continued until the turning off of the switch SW is detected based on the KEY-ON signal. Although the time charts of FIGS. 4, 8, and 11 are depicted such that the LEDs are turned on in the order of the LED 1, the LEDs 1 and 2, the LEDs 1 to 3, the LEDs 1 to 4, the LEDs 1 to 5, the odd-numbered LEDs 1, 3, and 5, and the even-numbered LEDs 2 and 4, this is for the purpose of facilitating the understanding of the description and does not necessarily mean that the LEDs are turned on in this order. The lighting control within any vertical dotted lines is performed based on the detection result of the remaining amount status of the battery 412.

What is claimed is:

1. A light emitting device drive controller comprising:
a first port that is connected to one end of a first light emitting device group where two light emitting devices are connected in parallel in the opposite directions;
a second port that is connected to the other end of the first light emitting device group as well as connected to one end of a second light emitting device group where two light emitting devices are connected in parallel in the opposite directions;
a third port that is connected to the other end of the second light emitting device group; and
a port state setting unit that selectively sets each of the first, second, and third ports to any one of a state of a first voltage, a state of a second voltage which is less than the first voltage, and a high impedance state for each consecutive predetermined period,
wherein the light emitting device drive controller drives selectively the light emitting devices constituting the first light emitting device group and the second light emitting device group in response to the states of the first, second, and third ports.

2. The light emitting device drive controller of claim 1, wherein the first port is a port that is further connected to a single light emitting device located between the first port and a fixed voltage determined in advance, and
wherein the light emitting devices constituting the first light emitting device group, the second light emitting device group and the single light emitting device are driven selectively in response to the states of the first, second, and third ports.

3. The light emitting device drive controller of claim 1, wherein the port state setting unit includes a plurality of logic circuits that is provided respectively for the first, second, and third ports to set each of the first, second, and third ports to any one of the state of the first voltage, the state of the second voltage, and the high impedance state for each of the predetermined periods.

4. The light emitting device drive controller of claim 3, wherein each of the plurality of logic circuits includes:

a P-MOSFET and an N-MOSFET connected serially that have drains forming a serial connection point connected to each of the first, second, and third ports; and
a logical circuit that operates the P-MOSFET and the N-MOSFET based on a first control signal turning off the P-MOSFET in the case of one logic level, a second control signal turning off the N-MOSFET in the case of one logic level, and a clock signal changed for each of the predetermined periods, and
wherein the logical circuit makes:
the serial connection point become the high impedance state regardless of the clock signal when the first control signal and the second control signal are one logic level;
the serial connection point become the state of the first voltage or the second voltage in synchronization with the clock signal when the first control signal and the second control signal are the other logic level;
the serial connection point become the high impedance state or the state of the second voltage in synchronization with the clock signal when the first control signal is one logic level and the second control signal is the other logic level; and
the serial connection point become the high impedance state or the state of the first voltage in synchronization with the clock signal when the first control signal is the other logic level and the second control signal is one logic level.

5. The light emitting device drive controller of claim 4, wherein the port state setting unit further includes a control signal generating unit that generates the first control signal and the second control signal, which become one or the other logic level in response to changes in a predetermined factor.

6. The light emitting device drive controller of claim 5, wherein the predetermined factor is a voltage value of a battery.

7. The light emitting device drive controller of claim 4, wherein the clock signal is a signal acquired by dividing an oscillating clock of a predetermined frequency generated from an oscillation circuit in a predetermined manner.

8. A light emitting device drive controller comprising:
a first port that is connected to one end of a first light emitting device group where two light emitting devices are connected in parallel in the opposite directions;
a second port that is connected to the other end of the first light emitting device group as well as connected to one end of the second light emitting device group where two light emitting devices are connected in parallel in the opposite directions;
a third port that is connected to the other end of the second light emitting device group;
a fourth port that is connected to the other end of a switch for checking a state of a change in a predetermined factor, the switch including one end connected to the first port;
a detecting unit that detects that the switch is closed; and
a port state setting unit that selectively sets all or some of the first, second, third, and fourth ports to any one of a state of a first voltage, a state of a second voltage which is less than the first voltage, and a high impedance state for each consecutive predetermined period based on a detection result when the detecting unit detects that the switch is closed and the state of the change in the predetermined factor,
wherein the light emitting device drive controller drives selectively the light emitting devices constituting the first light emitting device group and the second light emitting device group in response to the states of the first, second, third, and fourth ports.

9. The light emitting device drive controller of claim 8, wherein the first and fourth ports are ports further connected to a single light emitting device located between the first and fourth ports, and wherein the light emitting devices constituting the first light emitting device group, the second light emitting device group and the single light emitting device are driven selectively in response to the states of the first, second, third, and fourth ports.

10. The light emitting device drive controller of claim 8, wherein the port state setting unit includes a plurality of logic circuits that are provided respectively for the first, second, third, and fourth ports to set each of the first, second, third, and fourth ports to any one of the state of the first voltage, the state of the second voltage, and the high impedance state for each of the predetermined periods.

11. The light emitting device drive controller of claim 10, wherein at least one of the plurality of logic circuits includes:

a P-MOSFET and an N-MOSFET connected serially that have drains forming a serial connection point connected to each of the first, second, third, and fourth ports; and a logical circuit that operates the P-MOSFET and the N-MOSFET based on a first control signal turning off the P-MOSFET in the case of one logic level, a second control signal turning off the N-MOSFET in the case of one logic level, and a clock signal changed for each of the predetermined periods, wherein the logical circuit makes:

the serial connection point become the high impedance state regardless of the clock signal when the first control signal and the second control signal are one logic level;

the serial connection point become the state of the first voltage or the second voltage in synchronization with the clock signal when the first control signal and the second control signal are the other logic level;

the serial connection point become the high impedance state or the state of the second voltage in synchronization with the clock signal when the first control signal is one logic level and the second control signal is the other logic level; and the serial connection point become the high impedance state or the state of the first voltage in synchronization with the clock signal when the first control signal is the other logic level and the second control signal is one logic level.

12. The light emitting device drive controller of claim 11, wherein the port state setting unit further includes a control signal generating unit that generates the first control signal and the second control signal, which become one or the other logic level in response to changes in the predetermined factor.

13. The light emitting device drive controller of claim 8, wherein the predetermined factor is a voltage value of a battery.

14. The light emitting device drive controller of claim 11, wherein the clock signal is a signal acquired by dividing an oscillating clock of a predetermined frequency generated from an oscillation circuit in a predetermined manner.

15. The light emitting device drive controller of claim 8, comprising a timer that clocks a certain time period which is longer than the predetermined period based on a detection result when the detecting unit detects that the switch is closed, wherein the port state setting unit sets each of the first, second, third, and fourth ports to any one of the state of the first voltage, the state of the second voltage, and the high impedance state for each of the predetermined periods until the timer clocks the certain time period.

16. A light emitting device driving apparatus comprising:

a first light emitting device group where two light emitting devices are connected in parallel in the opposite directions;

a second light emitting device group where two light emitting devices are connected in parallel in the opposite directions;

a first port that is connected to one end of the first light emitting device group;

a second port that is connected to the other end of the first light emitting device group as well as connected to one end of the second light emitting device group;

a third port that is connected to the other end of the second light emitting device group; and a port state setting unit that selectively sets each of the first, second, and third ports to any one of a state of a first voltage, a state of a second voltage which is less than the first voltage, and the high impedance state for each consecutive predetermined period, wherein the light emitting device driving apparatus drives selectively the light emitting devices constituting the first light emitting device group and the second light emitting device group in response to the states of the first, second, and third ports.

17. A light emitting device driving apparatus comprising:

a first light emitting device group where two light emitting devices are connected in parallel in the opposite directions;

a second light emitting device group where two light emitting devices are connected in parallel in the opposite directions;

a switch for checking a state of a change in a predetermined factor;

a first port that is connected to one end of the first light emitting device group;

a second port that is connected to the other end of the first light emitting device group as well as connected to one end of the second light emitting device group;

a third port that is connected to the other end of the second light emitting device group;

a fourth port that is connected to the other end of the switch, the switch including one end connected to the first port;

a detecting unit that detects that the switch is closed; and a port state setting unit that selectively sets all or some of the first, second, third, and fourth ports to any one of a state of a first voltage, a state of a second voltage which is less than the first voltage, and the high impedance state for each consecutive predetermined period based on a detection result when the detecting unit detects that the switch is closed and the state of the change in the predetermined factor, wherein the light emitting device driving apparatus drives selectively the light emitting devices constituting the first light emitting device group and the second light emitting device group in response to the states of the first, second, third, and fourth ports.

* * * * *